(12) United States Patent
Muralimanohar et al.

(10) Patent No.: US 9,361,955 B2
(45) Date of Patent: Jun. 7, 2016

(54) MEMORY ACCESS METHODS AND APPARATUS

(75) Inventors: Naveen Muralimanohar, Santa Clara, CA (US); Aniruddha Nagendran Udipi, Salt Lake City, UT (US); Niladrish Chatterjee, Salt Lake City, UT (US); Rajeev Balasubramonian, Sandy, UT (US); Alan Lynn Davis, Coalville, UT (US); Norman Paul Jouppi, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 255 days.

(21) Appl. No.: 13/387,714

(22) PCT Filed: Jan. 27, 2011

(86) PCT No.: PCT/US2011/022763
§ 371 (c)(1),
(2), (4) Date: Jan. 27, 2012

(87) PCT Pub. No.: WO2011/094437
PCT Pub. Date: Aug. 4, 2011

(65) Prior Publication Data
US 2014/0208156 A1    Jul. 24, 2014

Related U.S. Application Data

(60) Provisional application No. 61/299,155, filed on Jan. 28, 2010.

(51) Int. Cl.
*G06F 11/10* (2006.01)
*G11C 7/10* (2006.01)
(Continued)

(52) U.S. Cl.
CPC .............. *G11C 7/10* (2013.01); *G06F 11/1088* (2013.01); *G11C 5/04* (2013.01); *G11C 8/12* (2013.01); *G11C 11/4082* (2013.01); *G06F 12/0802* (2013.01); *Y02B 60/1225* (2013.01)

(58) Field of Classification Search
CPC .................................................. G06F 11/1008
USPC .......................................... 714/718, 710, 624
See application file for complete search history.

(56) References Cited

U.S. PATENT DOCUMENTS

| 5,410,653 | A | 4/1995 | Macon, Jr. et al. |
| 5,606,717 | A | 2/1997 | Farmwald et al. |

(Continued)

FOREIGN PATENT DOCUMENTS

| CN | 101169967 | 4/2008 |
| CN | 101251828 | 8/2008 |

(Continued)

OTHER PUBLICATIONS

"Heard at Hot Interconnects: Multicore SoCs may require optical interconnect," Reed Business Information, Aug. 27, 2008, retrieved from http://www.edn.com/blog/Practical_Chip_Design/37757-Heard_at_Hot_Interconnects_Multicore_SoCs_may_require_optical_interconnect.php on Dec. 11, 2009, 2 pages.

(Continued)

*Primary Examiner* — Fritz Alphonse
(74) *Attorney, Agent, or Firm* — Hanley Flight & Zimmermann, LLC

(57) ABSTRACT

An example apparatus includes a row address register to store a row address corresponding to a row in a memory array. The example apparatus also includes a row decoder coupled to the row address register to assert a signal on a wordline of the row after the memory receives a column address. In addition, the example apparatus includes a column decoder to selectively activate a portion of the row based on the column address and the signal asserted on the wordline.

18 Claims, 21 Drawing Sheets

(51) Int. Cl.
*G11C 5/04* (2006.01)
*G11C 8/12* (2006.01)
*G11C 11/408* (2006.01)
*G06F 12/08* (2016.01)

(56) References Cited

U.S. PATENT DOCUMENTS

| | | | |
|---|---|---|---|
| 5,687,132 | A | 11/1997 | Rao |
| 5,802,569 | A | 9/1998 | Genduso et al. |
| 5,883,849 | A | 3/1999 | Shirley |
| 5,905,999 | A | 5/1999 | Liu |
| 5,963,468 | A | 10/1999 | Rao |
| 6,012,106 | A | 1/2000 | Schumann et al. |
| 6,061,290 | A | 5/2000 | Shirley |
| 6,173,356 | B1 * | 1/2001 | Rao .................... 711/5 |
| 6,175,535 | B1 | 1/2001 | Dhong |
| 6,222,786 | B1 | 4/2001 | Holland |
| 6,240,039 | B1 | 5/2001 | Lee et al. |
| 6,256,256 | B1 | 7/2001 | Rao |
| 6,279,135 | B1 | 8/2001 | Nguyen et al. |
| 6,349,364 | B1 | 2/2002 | Kai et al. |
| 6,557,080 | B1 | 4/2003 | Burger et al. |
| 6,768,692 | B2 | 7/2004 | Luk et al. |
| 7,107,384 | B1 | 9/2006 | Chen et al. |
| 7,409,491 | B2 | 8/2008 | Doblar et al. |
| 7,493,450 | B2 | 2/2009 | Bearden |
| 7,533,212 | B1 | 5/2009 | Doblar et al. |
| 7,872,892 | B2 | 1/2011 | MacWilliams et al. |
| 7,882,407 | B2 | 2/2011 | Abu-Rahma et al. |
| 7,957,216 | B2 | 6/2011 | Bains et al. |
| 8,732,406 | B1 | 5/2014 | Pase et al. |
| 2002/0041536 | A1 | 4/2002 | Tomita |
| 2003/0084386 | A1 * | 5/2003 | Barth et al. .................... 714/718 |
| 2004/0003179 | A1 | 1/2004 | Shirahige et al. |
| 2005/0018497 | A1 * | 1/2005 | Frankowsky ................ 365/200 |
| 2005/0111284 | A1 | 5/2005 | Akiyama et al. |
| 2007/0214325 | A1 | 9/2007 | Sasamoto |
| 2007/0233909 | A1 | 10/2007 | Derr et al. |
| 2007/0237020 | A1 | 10/2007 | Davis et al. |
| 2008/0010429 | A1 | 1/2008 | Rao |
| 2008/0094933 | A1 | 4/2008 | Kim |
| 2008/0229050 | A1 | 9/2008 | Tillgren |
| 2008/0256303 | A1 | 10/2008 | Croxford et al. |
| 2009/0006886 | A1 | 1/2009 | O'Connor et al. |
| 2009/0013211 | A1 | 1/2009 | Vogt et al. |
| 2009/0097851 | A1 | 4/2009 | Tan et al. |
| 2009/0196103 | A1 * | 8/2009 | Kim ..................... 365/185.12 |
| 2009/0198914 | A1 | 8/2009 | Arimilli et al. |
| 2009/0254689 | A1 | 10/2009 | Karamcheti et al. |
| 2009/0282182 | A1 | 11/2009 | Jeddeloh |
| 2010/0080076 | A1 | 4/2010 | Bains et al. |
| 2010/0268886 | A1 | 10/2010 | Frey et al. |
| 2011/0145496 | A1 | 6/2011 | Whaley et al. |
| 2011/0228600 | A1 | 9/2011 | Breitwisch et al. |
| 2011/0296118 | A1 | 12/2011 | Carter et al. |
| 2012/0198124 | A1 | 8/2012 | Post |
| 2013/0111147 | A1 | 5/2013 | Mogul et al. |

FOREIGN PATENT DOCUMENTS

| | | |
|---|---|---|
| JP | 08-315582 A | 11/1996 |
| JP | 2010146145 | 7/2010 |
| KR | 10-2007-7006577 A | 5/2007 |
| KR | 20070056110 A | 5/2007 |
| TW | 200620302 | 6/2006 |
| WO | WO2005/119687 A2 | 12/2005 |
| WO | WO-2011094436 | 8/2011 |
| WO | WO-2011094437 | 8/2011 |

OTHER PUBLICATIONS

A. N. Udipi et al., "Rethinking DRAM Design and Organization for Energy-Constrained Multi-Cores", Proc. ISCA, pp. 175-186, Jun. 19, 2010.

Ahn et al., "Future Scaling of Processor-Memory Interfaces", Proceedings of SC09, 13 pages, Nov. 14-20, 2009.

Bryan Gardiner, "Scientists Create First Memristor: Missing Fourth Electronic Circuit Element," http://www.wired.com/gadgetlab/2008/04/scientists-prov/ on Dec. 4, 2009, 3 pages.

D. H. Yoon et al., "Adaptive Granularity Memory Systems: A Tradeoff between Storage Efficiency and Throughput", Proc. ISCA, 12 pages, Jun. 4, 2011.

D. Locklear, "Chipkill Correct Memory Architecture," Technical Report, Dell, 4 pages, Aug. 2000.

E. Cooper-Balis et al., "Fine-Grained Activation for Power Reduction in DRAM", IEEE Micro, 14 pages, May 2010.

H. Zheng et al., "Mini-Rank: Adaptive DRAM Architecture for Improving Memory Power Efficiency", Proceedings of MICRO, pp. 210-221, 2008.

J. Ahn et al., "Multicore DIMM: an Energy Efficient Memory Module with Independently Controlled DRAMs", IEEE Computer Architecture Letters, vol. 7(1), 4 pages, 2008.

K. Sudan et al., "Micro-Pages: Increasing DRAM Efficiency with Locality-Aware Data Placement", Proc. ASPLOS, pp. 219-230, Mar. 13, 2010.

Michael Brown, "White Paper: The Memristor," retrieved from http://www.maximumpc.com/print/5814 on Dec. 4, 2009, 4 pages.

T. J. Dell, "A Whitepaper on the Benefits of Chipkill-Correct ECC for PC Server Main Memory," Technical report, IBM Microelectronics Division, 24 Pages, Nov. 19, 1997.

Vantrease, et al., "Light Speed Arbitration and Flow Control for Nanophotonic Interconnects," MICRO, New York, NY, Dec. 12, 2009, 12 pages.

Wikipedia, "Dynamic Random Access Memory," retrieved from http://en.wikipedia.org/wiki/Dynamic_random-access_memory on Feb. 10, 2011, 15 pages.

Wikipedia, "Memristor," retrieved from http://en.wikipedia.org/w/index.php?title=Memristor&oldid=328659258 on Dec. 4, 2009, 18 pages.

Wikipedia, "Synchronous Dynamic Random Access Memory," retrieved from http://en.wikipedia.org/wiki/Synchronous_dynamic_random_access_memory on Feb. 10, 2011, 12 pages.

International Search Report and Written Opinion received in PCT Application No. PCT/US2011/022763, dated Sep. 22, 2011, pp. 14.

EPO; "Supplementary European Search Report"; cited in EP Appl. 11737663.2; mailed Mar. 4, 2014; 8 pages.

\* cited by examiner

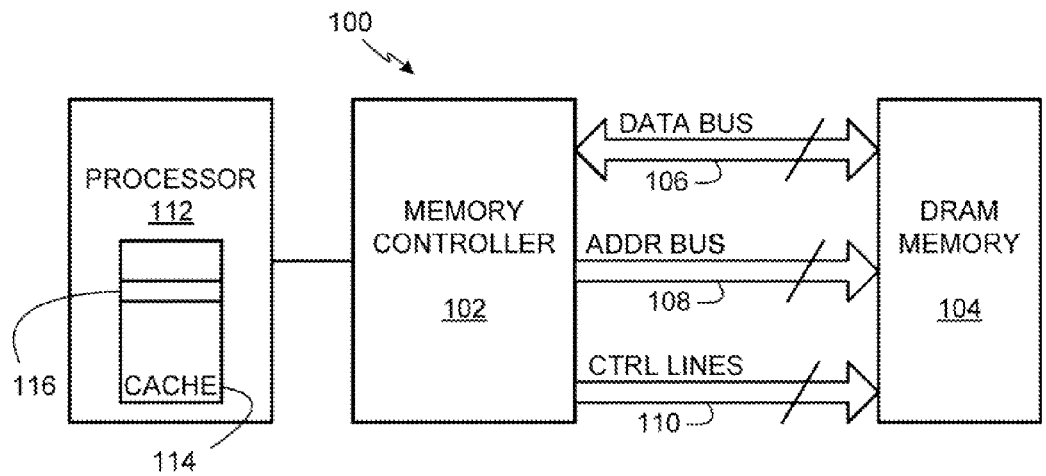
FIG. 1
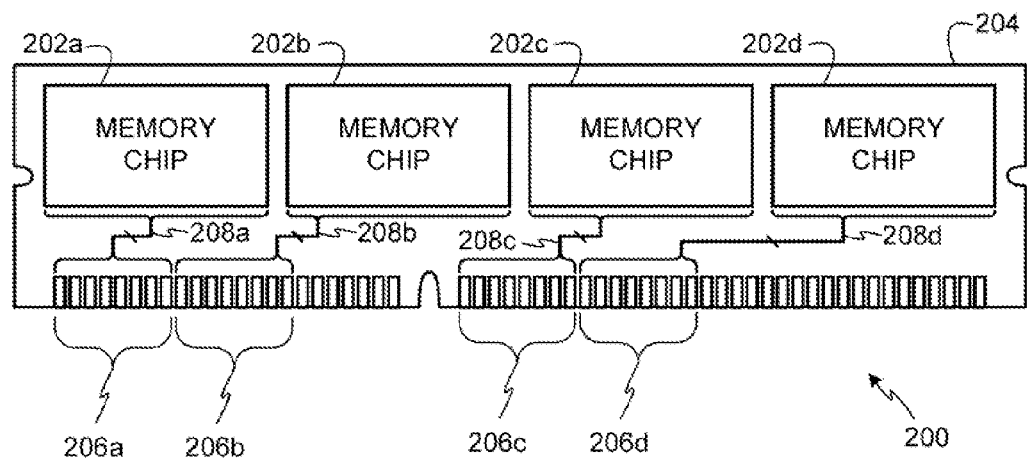
FIG. 2
FIG. 3
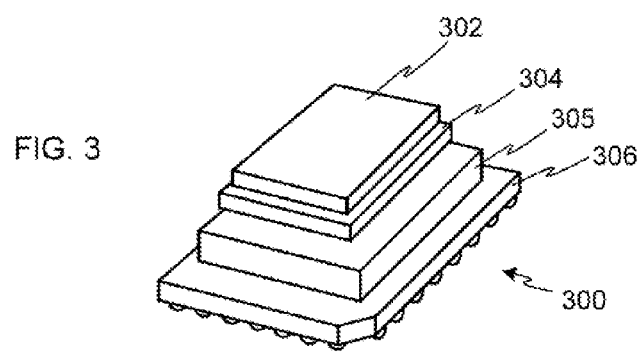

1900

| Processor | 8-Core OOO, 2GHz |
|---|---|
| L1 cache | Fully Private, 3 cycle 2-way, 32 KB each I and D |
| L2 cache | Fully shared, 10 cycle 8-way, 2 MB, 64B Cache lines |
| Row-buffer size | 8 KB |
| DRAM Frequency | 400 MHz |
| DRAM Part | 512MB, x8 |
| Devices per DIMM | 8 |
| Channels | 1 |
| Ranks | 2 |
| Banks | 4 |
| T-rcd, T-cas, T-rp | 5 cyc |

TEST BENCH PARAMETERS

| Component | Dynamic Energy (nJ) |
|---|---|
| Decoder/Wordline - Baseline | 1.429 |
| Decoder/Wordline - SBA | 0.024 |
| Decoder/Wordline - SSA | 0.013 |
| Bitlines - Baseline | 19.282 |
| Bitlines - SBA/SSA | 0.151 |
| Termination Resistors Baseline/SBA/SSA | 14.569 |
| Output Drivers | 2.185 |
| Others - Baseline/SBA/SSA | 1.143 |
| Low-power mode | Background power (mW) |
| Active | 142.5 |
| Power Down (3 mem. cyc) | 19 |
| Self Refresh (200 mem. cyc) | 6.1 |

ENERGY CONSUMPTION COMPARISONS

FIG. 20

ROW BUFFER HIT RATES

ROW USE COUNT FOR 8 CHIPS

NORMALIZED TOTAL DRAM ENERGY CONSUMPTION

CONTRIBUTORS TO TOTAL DRAM ENERGY CONSUMPTION

MEMORY LATENCY IMPACT OF USING LOW-POWER STATES

ENERGY REDUCTION USING LOW-POWER STATES

AVERAGE MAIN MEMORY LATENCY

CONTRIBUTORS TO TOTAL MEMORY LATENCY

NORMALIZED IPCs FOR DIFFERENT MEMORY STRUCTURES

PERFORMANCE OF CHIPKILL SSA V. NON-CHIPKILL SSA

MEMORY ACCESS METHODS AND APPARATUS

RELATED APPLICATIONS

This is a national stage entry of International Patent Cooperation Treaty patent application No. PCT/US2011/022763, filed on Jan. 27, 2011, that claims the benefit of U.S. Provisional Patent Application No. 61/299,155, filed on Jan. 28, 2010, each of which is hereby incorporated herein by reference in its entirety.

BACKGROUND

Traditionally, memories such as dynamic random access memories (DRAMs) have been designed for low-cost and fast access time. However, gains in cost and access speed have been made via tradeoff decisions resulting in increased power-consumption. A DRAM is made of thousands of transistors organized to form bit cells that store bit-level information. When accessed together, combinations of bit cells can store meaningful and/or useful information. DRAM architectures include signal busses used to activate different combinations of bit cells for writing and/or reading information at addressable storage locations.

Some traditional DRAM architectures are structured such that a DRAM can be operated to quickly retrieve data stored at sequential address locations in response to a single data request and address provided by a processor or memory controller. For example, processors are typically configured to retrieve one or more entire cache lines from DRAM based on a single read request. In a traditional DRAM module, a single conventional read operation requires pre-charging an entire row of bitlines in each DRAM chip of the DRAM module. Each pre-charged row typically corresponds to multiple cache lines.

BRIEF DESCRIPTION OF THE DRAWINGS

FIG. 1 depicts an interface configuration between a memory controller and a memory.

FIG. 2 depicts an example printed circuit board (PCB) in-line memory module having a plurality of memory chips.

FIG. 3 depicts an example chip stack memory module.

FIG. 19 is a table showing example test bench parameters of an example processor system model used to analyze the performance of the example methods, apparatus, and articles of manufacture disclosed herein.

FIG. 20 is a table showing example DRAM energy parameters of the example memory access techniques and structures disclosed herein and known memory access techniques and structures that were used to implement the performance analyses.

DETAILED DESCRIPTION

Figure 4:
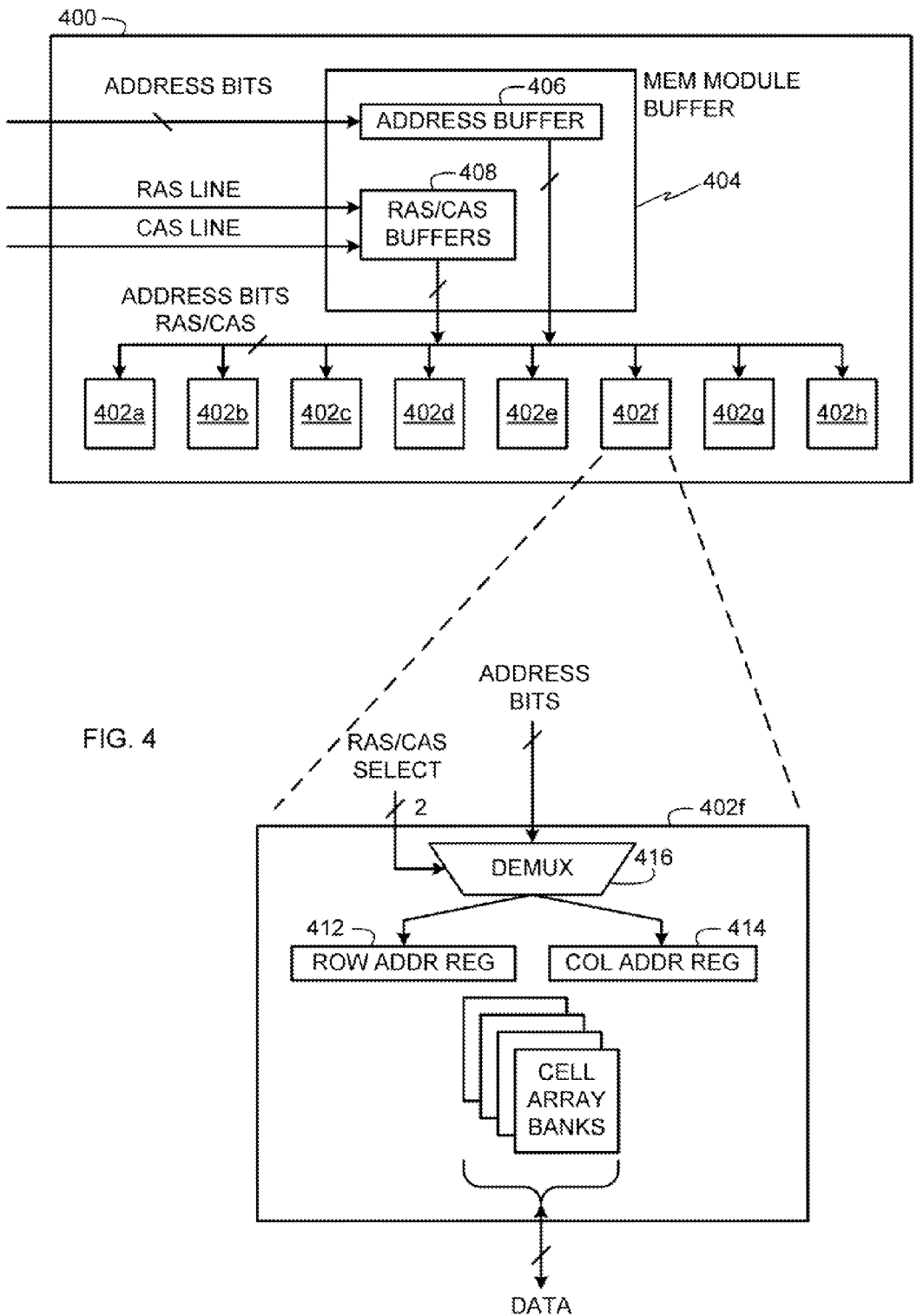
FIG. 4 is a dynamic random access memory (DRAM) configuration to selectively activate particular segments of rows by delaying use of a row address to access information stored therein.

Example methods, apparatus, and articles of manufacture disclosed herein can be used to implement electronic memory devices that consume less power than traditional memory devices. Example methods, apparatus, and articles of manufacture are disclosed in connection with dynamic random access memory (DRAM) architectures, but may be implemented in connection with other types of memories including memristor memory devices, static RAM (SRAM) devices, Ferroelectric RAM (FRAM) devices, etc.

Traditionally, DRAM has been designed for low-cost and fast access time. However, gains in cost and access speed have been made via tradeoff decisions resulting in increased power-consumption. A DRAM is made of thousands of transistors organized to form bit cells that store bit-level information. When accessed together, combinations of bit cells can store meaningful and/or useful information. DRAM architectures include signal busses used to activate different combinations of bit cells for writing and/or reading information at addressable storage locations. As discussed in greater detail below, bitlines are selectively enabled or activated to selectively read or write information in different bit cells.

To increase performance, while maintaining or decreasing physical space requirements, some traditional DRAM architectures are structured such that a DRAM can be operated to quickly retrieve data stored at sequential address locations in response to a single data request and address provided by a processor or memory controller. However, such data access techniques typically result in retrieving more information from a memory than is necessary and, thus, unnecessarily consume more power by activating portions of memory that may not otherwise be needed. For example, processors are typically configured to retrieve one or more entire cache lines from DRAM based on a single read request. A cache line refers to the number of bits or bytes that make up the width of a processor's cache memory (e.g., a 32-byte cache line, a 64-byte cache line, a 128-byte cache line, etc.). In a traditional DRAM module, a single conventional read operation requires pre-charging an entire row of bitlines in each DRAM chip of the DRAM module. Each pre-charged row typically corresponds to multiple cache lines. Thus, even when a processor requests a single cache line, internal DRAM logic must pre-charge all of the bitlines of the DRAM chip row(s) that store(s) the requested cache line. Pre-charging an entire row activates thousands of bitlines even though only a subset of those activated bitlines store the single relevant cache line requested by the requesting processor. Such known access techniques, achieve fast access performance when there is high locality of adjacently stored information that is needed by the requesting processor in a consecutive manner. That is, by pre-charging an entire row, every cache line stored in that row can be read-out to the requesting processor during consecutive low-latency read cycles (e.g., DRAM burst-mode reads or page-mode reads). While there is some initial overhead delay in pre-charging to read-out the first cache line, each subsequent consecutive cache line can be read out with much lower latency because the row storing those cache lines has already been pre-charged. However, if the requesting processor requires only one cache line from the pre-charged row, significant energy is wasted using these known techniques, especially when memory access locality is reduced as core, thread, and socket counts increase in processor operations.

Unlike traditional DRAM architectures and operations, example methods, apparatus, and articles of manufacture disclosed herein facilitate accessing memory devices, while consuming relatively lower power by activating relatively less DRAM circuitry per memory access than known DRAM devices. An example implementation referred to herein as Selective Bitline Activation (SBA) involves configuring DRAM control logic to selectively access single cache lines by applying address information differently from the manner in which traditional DRAM architectures use such address information. Using SBA, an internal DRAM architecture can operate while maintaining compatibility with industry-adopted external interface device standards used to ensure compatible interoperability between different memory controllers and different memory device manufacturers. The JEDEC Solid State Technology Association (formerly the Joint Electron Devices Engineering Council (JEDEC)) publishes and maintains several DRAM interface standards that are used to establish interface timing and control requirements to which memory device manufacturers must adhere.

Another example implementation referred to herein as Single Subarray Access (SSA) organizes the layout of DRAM chips and the mapping of data to DRAM chips so that an entire cache line can be fetched from a single DRAM memory chip of a memory module. In contrast, known memory modules, such as known single in-line memory module (SIMM) or dual in-line memory module (DIMM) architectures, fetch a cache line from separate cache line portions or cache line segments distributed among multiple DRAM chips of a memory module. (A cache line segment is a subgroup of bits that form a portion of an entire cache line.) Thus, unlike traditional DRAM configurations, in which multiple chips in a memory module must be activated or pre-charged to read out a single cache line, example SSA techniques disclosed herein enable reading out an entire cache line by activating only a single memory chip of a memory module. By eliminating the need to activate and pre-charge multiple memory chips of a memory module to access a single cache line, relatively less power is used per memory access because the non-activated memory chips in the memory module can remain in a low-power consumption mode throughout the fetch operation. Example preliminary studies show that memory designs configured in accordance with the SSA memory access technique can yield memory energy savings of 6×, while incurring an area cost of only 4.5%, and improving performance (e.g., read latency) by up to 15%.

Example methods and apparatus are also disclosed herein to provide error detection and correction capabilities through the use of checksum information. Such error detection and correction capabilities involve the use of chipkill techniques and may be advantageously used in connection with the SSA memory access technique disclosed herein, which relies on a single memory chip to provide the entire contents of a single cache line. The error detection and correction capabilities are not, however, committed for use only with the SSA techniques. Example preliminary studies show that the chipkill implementation described herein has significantly lower capacity and energy overheads than known chipkill solutions, while incurring only an 11% performance penalty over a comparable memory implementation without chipkill error detection and correction capabilities.

In the following description and corresponding figures, FIG. 1 shows a memory interface representative of interface line configurations that can be used in either of the SBA or SSA memory access techniques. The diagrams of FIGS. 4, 6, 7, and 14 are used, by way of example, to describe example memory implementations using SBA memory configurations. The diagrams of FIGS. 8-13, 15, and 16 are used, by way of example, to describe example memory implementations using SSA memory configurations. The chipkill error detection and correction capabilities are described in connection with FIGS. 17 and 18.

Turning now to FIG. 1, an example memory interface configuration 100 shows a memory controller 102 operatively coupled to a memory 104. The memory controller 102 can be a standalone memory controller integrated circuit (IC) or an embedded memory controller implemented in a processor chip (e.g., fabricated on the same die or located in the same chip package as a processor core). In the illustrated example, the memory 104 is a DRAM memory. The DRAM memory 104 can be a single DRAM memory IC or a memory module including multiple DRAM memory ICs. In some example implementations, the DRAM memory 104 can be embedded memory implemented in a processor chip. As shown, the memory interface configuration 100 includes a data bus 106, an address bus 108, and control lines 110.

The data bus 106 may be any number of bits wide and is used to communicate data between the memory controller 102 and the DRAM memory 104. When implemented as a memory module (e.g., the memory modules of FIGS. 2 and 3), the lines of the data bus 106 can be formed of separate data line groups corresponding to data buses of respective memory chips.

Turning briefly to FIGS. 2 and 3, the example memory modules 200 and 300 depicted therein can be used to implement any of the memory configurations disclosed herein. In the example illustrated in FIG. 2, a DRAM PCB in-line memory module 200 (e.g., a dual in-line memory module (DIMM)) is implemented as a multi-chip memory module including four memory chips 202a-d mounted on a PCB 204. The DRAM PCB in-line memory module 200 may be advantageously used in optical interface systems in which the memory module 200 is connected to other subsystems (e.g., other memory modules and/or memory controllers) via optical lines. Alternatively, the memory module 200 may also be used in electrical interface systems. A data bus 208a-d of each of the memory chips 202a-d interfaces with a respective, separate data line group 206a-d of the DRAM memory module 200. Each data line of the memory module 200 can be implemented using an electrical contact pad formed (e.g., etched) on the PCB 204 and connected to a respective one of the memory chips 202a-d via an electrically conductive trace formed in and/or on the PCB 204.

In some examples, one or more of the memory chips 202a-d are implemented using a 3D chip stack in which multiple memory dies (e.g., of homogeneous or heterogeneous memory technology types) are stacked on top of one another (e.g., similar to the 3D stack structure shown in FIG. 3).

An example 3D chip stack memory module 300 is shown in FIG. 3. The 3D stacked memory module 300 may be advantageously used in electrical interface systems in which the memory module 300 is connected to other subsystems (e.g., other memory modules and/or memory controllers) via electrical lines. Alternatively, the memory module 300 may also be used in optical interface systems. The example 3D chip stack memory module 300 of FIG. 3 includes a first IC die 302 stacked on a second IC die 304, which is stacked on a third IC die 305. The IC dies 302, 304, and 305 are carried on a ball grid array (BGA) chip package 306. In the illustrated example, the first IC die 302 can be a SDRAM memory and the second IC die 304 can be another SDRAM memory or any other type of memory (e.g., memristor memory, SRAM, flash memory, PCRAM, etc.) or IC (e.g., a processor, a controller, etc.). In example implementations in which an SDRAM die (or any other memory technology die) is stacked on a processor or controller die, address, control, and data lines of the SDRAM die can be routed directly to the processor or controller die internal to the chip stack package. In such implementations, memory access external from the chip stack package might not be necessary. Alternatively or additionally, to enable external memory access, address, control, and data lines of the memory IC dies can be routed to external chip interfaces (e.g., BGA pads, surface mount pads, chip leads, etc.). In some examples, a memory module buffer may be stacked with multiple memory die. For example, in the illustrated example of FIG. 3, the IC die 305 may be a memory module buffer (e.g., similar or identical to memory module buffers 404 of FIG. 4, 908 of FIG. 9, 1008 of FIG. 10, and/or 1104 of FIG. 11). Although the 3D chip stack memory module 300 is shown as a BGA package, other types of packages may be used.

Returning to FIG. 1, the address bus 108 is used to communicate address information from the memory controller 102 to the DRAM memory 104. In DRAM architectures, an address for each memory controller-initiated memory access may be communicated in two parts during two consecutive address communications. During a first address part communication, the memory controller 102 may output a row address on the address bus 108. During a second address part communication, the memory controller 102 may output a column address on the address bus 108. To provide access to the desired information addressed by the memory controller 102, the DRAM memory 104 latches the row and column addresses to activate corresponding bit cells for read or write access.

In the illustrated example, the control lines 110 can include control lines suitable for implementing DRAM or synchronous DRAM (SDRAM) type interfaces. Such control lines can include a row address strobe (RAS) line, a column address strobe (CAS) line, a write-enable (WE) line, a chip select (CS) line, a clock (CLK) line, a clock enable (CE) line, bank select lines, etc. In some example implementations, bank select lines can be connected to lines of the address bus 108. In some example implementations, SDRAM-type interfaces can be used in connection with non-SDRAM type memory technologies. For example, an SDRAM interface may be used to interface to a memristor IC die or a SRAM IC die so that interface compatibility can be maintained with SDRAM memory controllers even though different memory technologies are employed.

Also shown in FIG. 1 is a processor 112 in communication with the memory controller 102. The processor 112 includes a cache memory 114 that functions as a temporary quick access storage area for a processor core of the processor 112. The cache memory 114 is formed of a plurality of cache lines, one of which is denoted as cache line 116. In some example processor system implementations, a size of a cache line (e.g., a 64-byte cache line, a 128-byte cache line, etc.) dictates the number of bits that may be read from an external memory (e.g., a DRAM) per memory access. For example, if the cache line 116 is 64 bytes wide and the DRAM memory 104 is a memory module (e.g., the PCB in-line memory module 200 of FIG. 2) with a 64-bit data bus, the memory controller 102 can retrieve the 64-byte wide cache line from the DRAM memory 104 using eight read cycles. Alternatively, if the DRAM memory 104 is a single DRAM chip having an 8-bit data bus, the memory controller 102 can retrieve the 64-byte wide cache line using 64 8-bit read cycles.

Turning now to FIG. 4, in accordance with SBA memory access, a DRAM configuration selectively activates particular segments of rows in respective DRAM chips by delaying use of a row address to access information stored therein. As shown in FIG. 4, a multi-chip memory module 400 includes a plurality of DRAM chips 402a-h and a memory module buffer 404. In the illustrated example, the memory module buffer 404 includes an address buffer 406 to receive and buffer row and column addresses and RAS/CAS buffers 408 to receive and buffer RAS and CAS signals from a memory controller. Although the RAS/CAS buffers 408 are shown, in other example implementations, the RAS/CAS buffers 408 may be omitted and the memory module buffer 404 can dynamically (or on-the-fly) generate the RAS and CAS signals as needed when communicating address information (e.g., row and column addresses) to the DRAM chips 402a-h. In some examples, the memory module buffer 404 may be omitted and memory module buffers substantially similar or identical to the memory module buffer 404 may be implemented in one or more of the DRAM chips 402a-h such that the memory module 400 would operate the same as if it were provided with the memory module buffer 404 as shown in FIG. 4.

In the illustrated example, signal timings required by the memory module 400 are the same as signal timings of traditional memory modules. As a result, the memory module 400 can be used in connection with known or legacy memory controllers. However, as explained below, the operation of each of the DRAM chips 402a-h is different from the manner in which traditional memory chips operate to provide access to stored memory contents.

Upon receiving a row address in the address buffer 406 and a RAS signal at the RAS/CAS buffers 408, the address buffer 406 and the RAS/CAS buffers 408 of the illustrated example communicate the row address and the RAS signal in broadcast fashion to all of the DRAM chips 402a-h. In addition, upon receiving a column address in the address buffer 406 and a CAS signal at the RAS/CAS buffers 408, the address buffer 406 and the RAS/CAS buffers 408 of the illustrated example communicate the column address and the CAS signal in broadcast fashion to all of the DRAM chips 402a-h. In this manner, the memory module 400 is backwards compatible with known memory controllers.

However, unlike known DRAM memory chips, the DRAM chips 402a-h delay use of the received row address to enable selectively activating relatively less circuitry of a DRAM storage area per memory access than is activated by known DRAM technologies. In this manner, SBA memory accesses use less power per memory access by activating relatively less circuitry. To enable SBA memory accesses, each SDRAM chip 402a-h is provided with a row address register 412 and a column address register 414, which are shown by way of example in connection with SDRAM chip 402f. The row address register 412 enables use of a posted RAS by storing the row address to postpone its use in decoding an address of requested data until a CAS signal and column address are received.

The SDRAM chip 402f is provided with a demultiplexer 416 to select one of the row address register 412 or the column address register 414. A RAS/CAS select input to the demultiplexer 416 is connected to the RAS/CAS buffers 408 to control the demultiplexer 416 to select either the row address register 412 or the column address register 414 to store a received address. For example, under traditional timings, the memory module 400 receives a row address in connection with an assertion of a RAS control signal. That is, the row address is latched into the address buffer 406 and communicated to the DRAM chip 402f (and to the other DRAM chips 402a-e, 402g, and 402h), while the RAS assertion signal is latched into the RAS/CAS buffers 408 and also communicated to the DRAM chip 402f (and to the other DRAM chips 402a-e, 402g, and 402h). Similarly, under traditional timings, the memory module 400 receives a column address in connection with an assertion of a CAS control signal. That is, the column address is latched into the address buffer 406 and communicated to the DRAM chip 402f (and to the other DRAM chips 402a-e, 402g, and 402h), while the CAS assertion signal is latched into the RAS/CAS buffers 408 and also communicated to the DRAM chip 402f (and to the other DRAM chips 402a-e, 402g, and 402h). Thus, when the demultiplexer 416 senses an assertion of the RAS signal, the address bits at its address inputs correspond to the row address, and the demultiplexer 416 selects the row address register 412 to store the address bits. Similarly, when the demultiplexer 416 senses an assertion of the CAS signal, the address bits at its address inputs correspond to the column address, and the demultiplexer 416 selects the column address register 414 to store the address bits.

Unlike known techniques that act on a row address by activating an entire row of a bit cell array bank before receiving the column address, the DRAM chip 402f of the illustrated example waits until both of the row address and column address are received before decoding the row and column addresses and before activating any of the bit cell access circuitry. In this manner, the DRAM chip 402f can use the row and column addresses concurrently in combination to activate only the necessary storage area corresponding to the requested memory access and, thus, retrieve only a relevant cache line into a row buffer. Thus, in the illustrated example, when both the row address and the column address for a particular memory access are stored in the registers 412 and 414, row and column decoders activate only the portion of a row that stores the specific information that is requested and addressed by the combination of the row and column addresses. This concept is illustrated in greater detail in FIG. 6.

Figure 5:
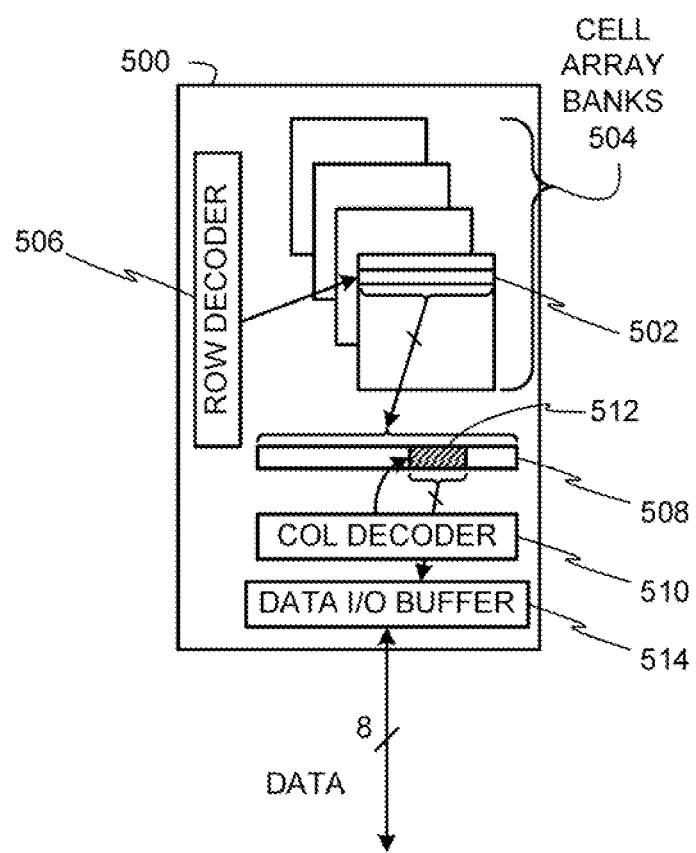
FIG. 5 is a diagram of known DRAM chip.
Figure 6:
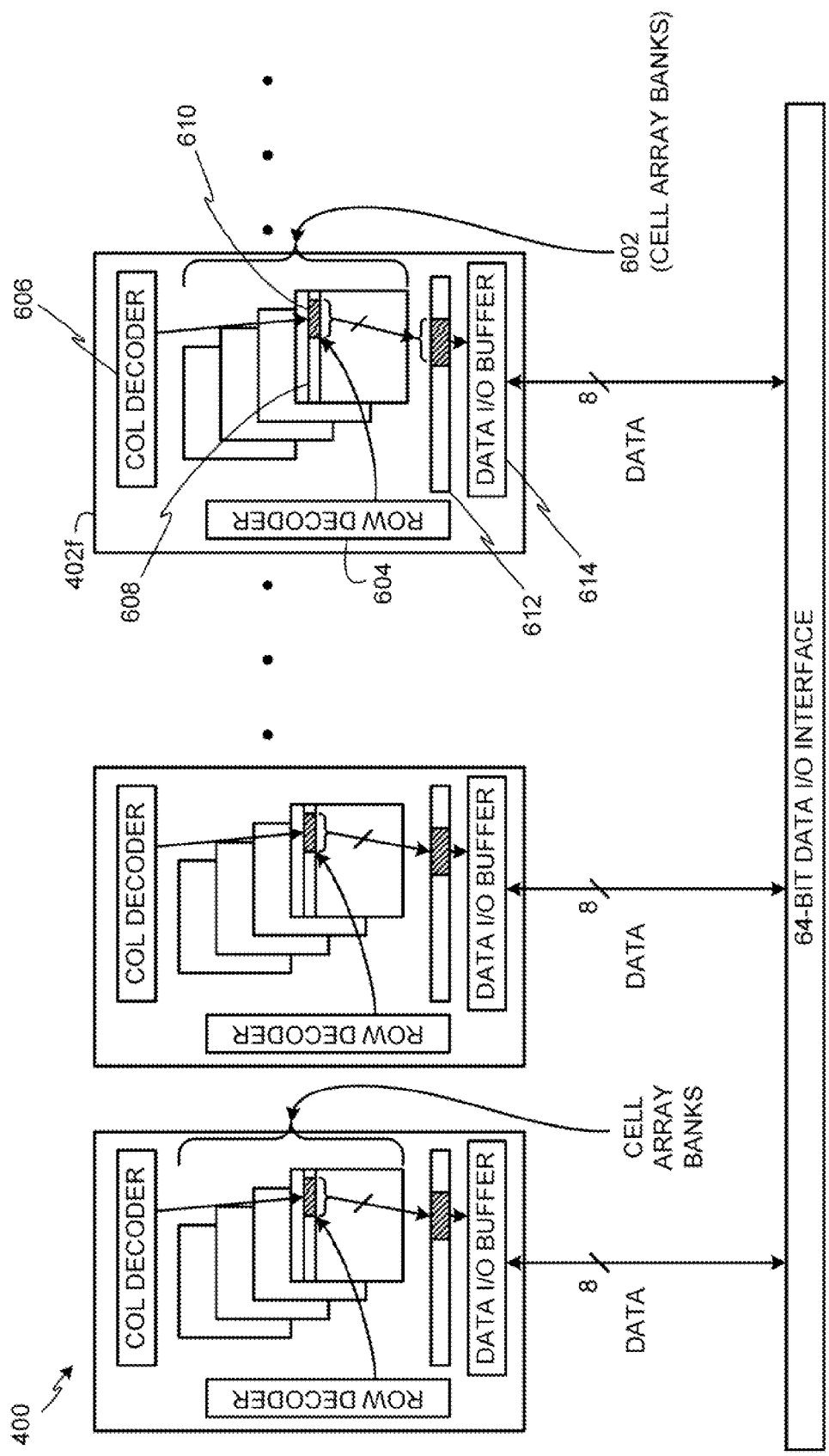
FIG. 6 is a diagram of the DRAM configuration of FIG. 4 showing row and column address decoders working cooperatively to selectively activate specific segments of rows in DRAM bit cell array banks.

Before continuing to FIG. 6, a brief discussion of the operation of known DRAM chips may be instructive. Unlike the operation of the DRAM chip 402f described in connection with FIGS. 4, 6, and 7, known DRAM chips activate an entire row per memory access as shown in FIG. 5. Turning to FIG. 5, upon receipt of a row address and before receiving a column address, a known DRAM chip 500 activates an entire row 502 of a cell array bank 504 based on the row address loaded into a row decoder 506. In known DRAM chips, activating an entire row is referred to as opening a page such that a page-mode access is enabled for consecutively reading out bursts of adjacently stored information. When the entire row 502 is active, the DRAM chip 500 loads all of the bits of the active row 502 into a row buffer 508. When the DRAM chip 500 receives a column address, a column decoder 510 decodes the column address and selects a particular portion 512 of the row buffer 508 and outputs the row buffer portion 512 via a data I/O buffer 514. Thus, known DRAM chips activate an entire row and load all of the bits of the active row into a row buffer before receiving a column address. Activating an entire row in this manner for each memory access results in consuming more power than necessary when only a portion of the information stored in that row is requested. The example SBA techniques described herein reduce power consumption by only activating a portion of a row in a cell array bank storing relevant information as discussed below in connection with FIGS. 6 and 7.

Turning to FIG. 6, the DRAM chip 402f is shown with a plurality of bit cell array banks 602 that store information, a row decoder 604, and a column decoder 606. Each bit cell array bank 602 is arranged as rows of bit cells that store information. A row 608 is shown in one of the banks 602 and is also referred to herein as a wordline. In the illustrated example, the row decoder 604 receives the row address from the row address register 412 (FIG. 4), and the column decoder 606 receives the column address from the column address register 414 (FIG. 4). The row decoder 604 and the column decoder 606 then concurrently decode their respective address information to activate only a portion of the row 608 (or wordline) within a particular one of the cell array banks 602 containing the requested information. The activated portion of the row 608 is denoted herein as a wordline segment 610, which is a portion of the row 608 that is activatable without requiring activation of other portions of the same row 608. In the illustrated example of FIG. 6, separate wordline segments of respective ones of the DRAM chips 402a-h can be activated and read out as discussed below with reference to the DRAM chip 402f. In this manner, the bits read out from the separate SDRAM chips 402a-h can be concatenated to form a cache line requested by a memory controller (e.g., the memory controller 102 of FIG. 1). In the illustrated example of FIG. 6, a 64-byte cache line is formed by concatenating 8-bit data outputs from each of the DRAM chips 402a-h to form eight 64-bit cache line portions or segments that are subsequently concatenated to form the entire cache line.

When the wordline segment 610 is active, its bits are loaded into a row buffer 612 for output via data I/O buffer 614. By activating only a relevant wordline segment (e.g., the wordline segment 610) in a row, the SBA technique imposes a close-page policy, which prevents burst accesses associated with known DRAM chips that allow opening a row (or page) once and reading out two or more row segments (e.g., multiple 8-bit data readouts) based on the single row opening. Instead, the close-page policy of SBA memory accesses requires decoding a row address for each memory access. However, the close-page policy is more energy-efficient than known DRAM chip access techniques when used in connection with applications in which relevant data is not stored with high locality (e.g., not often stored in the same row), because while known DRAM chip accesses will open an entire row even when only a single datum (e.g., a cache line) in that row is relevant (which is often the case for information stored with low locality), the SBA techniques described herein only open a single wordline segment of a row per memory access.

The wordline segment 610 can include a number of bits equal to or greater than the width of the data I/O bus of the DRAM chip 402f. In the illustrated example, each of the DRAM chips 402a-h has an 8-bit data I/O bus. Thus, for a cache line that is 64 bytes wide, each activated wordline segment (the wordline segment 610) of each DRAM chip 402a-h stores a portion or segment of a requested 64-byte cache line. When each of the DRAM chips 402a-h retrieves 8 bits from its respective wordline segment, the 8 bits from each of the DRAM chips 402a-h are concatenated to form 64 bits output by the memory module 400. This process can be repeated until the DRAM chips 402a-h have provided the entire 64-byte cache line. In such an example implementation, each of the DRAM chips 402a-h stores a respective 8 bytes of the 64-byte cache line.

Figure 7:
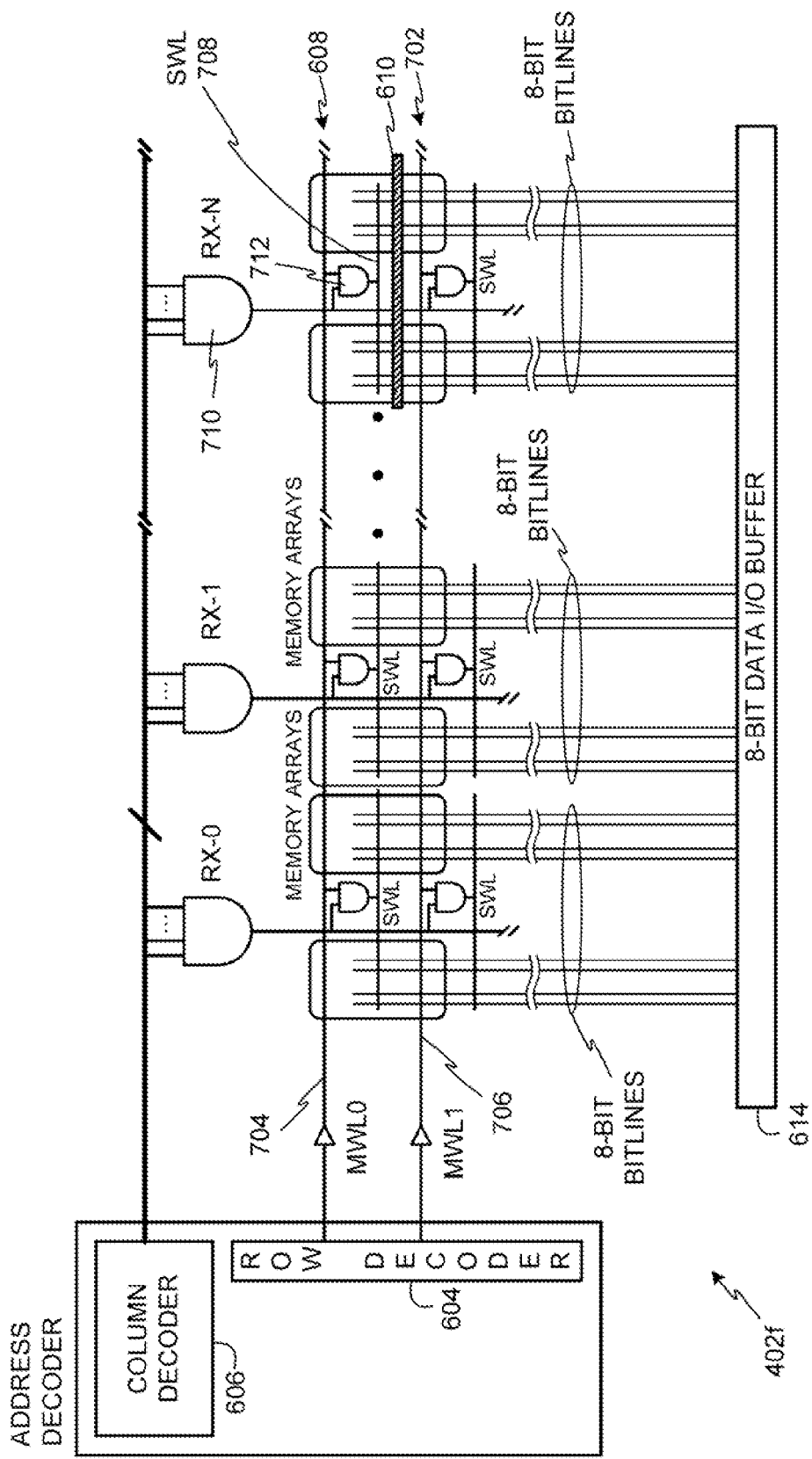
FIG. 7 is a detailed diagram of one of the DRAM chips of the DRAM configuration of FIGS. 4 and 6 showing row and column address decoders of the DRAM chip working cooperatively to selectively activate particular bitlines of the DRAM chip.

FIG. 7 is a detailed diagram of the DRAM chip 402f of the example memory module 400 of FIGS. 4 and 6 showing the row decoder 604 and the column decoder 606 of the DRAM chip 402f working cooperatively to selectively activate particular bitlines of the DRAM chip 402f per memory access. The illustrated example of FIG. 7 shows how hierarchical wordlines can be used to selectively activate portions of rows or wordlines without activating portions of the row that do not include data of interest (e.g., selectively activate the wordline segment 610 of the row 608 as shown in FIG. 6) to perform SBA memory accesses.

In the illustrated example of FIG. 7, two rows (or wordlines) 608 and 702 of the DRAM chip 402f are shown. Each row 608 and 702 includes a main wordline (MWL) and controlling sub-wordlines (SWL). In some example implementations, the MWL's can be formed in first-level metal and the SWLs can be formed in a poly layer. In the illustrated example, access to the row 608 is enabled through assertion of a MWL0 line 704 and access to the row 702 is enabled through assertion of a MWL1 line 706. The SWL's connect to memory bit cells in different memory cell arrays. In the illustrated example, a SWL 708 connects to the wordline segment 610 of FIG. 6 to enable selectively activating the wordline segment 610 to transfer its bits to the data I/O buffer 614.

To enable activating the SWLs, the DRAM chip 402f is provided with region select (RX) 'AND' gates, one of which is denoted by reference numeral 710. In addition, the DRAM chip 402f is provided with SWL 'AND' gates, one of which is denoted by reference numeral 712. The RX 'AND' gates (e.g., RX-0, RX-1, RX-N) and the SWL 'AND' gates enable selecting particular SWLs within respective columns of memory arrays. Although 'AND' gates are shown in the illustrated example, 'NOR' gates can be used instead, and the signal polarities of MWL and RX signal lines can be inverted to operate with the 'NOR' gates. In the illustrated example, a first input of the SWL 'AND' gate 712 is connected to the RX-N 'AND' gate 710 and a second input of the SWL 'AND' gate 712 is connected to the MWL0 line 704. In addition, the output of the SWL 'AND' gate 712 is connected to the SWL 708 to activate the SWL 708 upon assertion of the MWL0 line 704 and the output of the RX-N 'AND' gate 710. The other SWL 'AND' gates of the DRAM chip 402f are connected in an analogous manner so that any one of the SWLs of the DRAM chip 402f can be selected for outputting based on selecting a corresponding combination of an RX 'AND' gate (e.g., the RX-N 'AND' gate 710) and a MWL (e.g., the MWL0 line 704).

As shown in FIG. 7, the MWL0 line 704 and the MWL1 line 706 are connected to the row decoder 604, and the RX 'AND' gates are connected to the column decoder 606. In an example implementation that uses 15 bits for row addresses, the row decoder 604 can decode the selection of up to 32,768 MWLs. In an example implementation that uses 11 bits for column addresses, the inputs of the RX 'AND' gates can be connected to the least significant 7 bits of the column address interface of the column decoder 606 to enable individual selection of any one of up to 128 SWLs. In the illustrated example, when the row decoder 604 asserts a high signal on the MWL0 line 704 and the address output by the column decoder 606 selects the RX-N 'AND' gate 710, the inputs of the SWL 'AND' gate 712 are both high, causing the output of the SWL 'AND' gate 712 to activate the wordline segment 610 for outputting its bits onto the data I/O buffer 614.

In the illustrated example of FIG. 7, the MWL0 line 704 and the MWL1 line 706 are loaded only by a few SWL 'AND' gates, which significantly reduces the capacitance on the MWLs and, thus, their signal propagation delays. When only a subset of the CAS address is used to trigger RX signals associated with the RX 'AND' gates as discussed above, the activation area and wordline/bitline energy is advantageously reduced (e.g., less address lines are routed). In addition, energy is also advantageously conserved because the MWLs are not directly connected to the memory cells. As a result of not being directly connected to the memory cells, activation of an MWL across a memory array does not result in destruction of data, because only a small subset of memory cells (e.g., the wordline segment 610) connected to the active SWL read their data out.

In some example implementations, it may be die-area prohibitive or cost-prohibitive to provide the quantity of 'AND' gates (e.g., SWL 'AND' gates and RX 'AND' gates) to enable a single cache line per access. In such example implementations, less 'AND' gates can be provided with the tradeoff in energy required to activate and read out more cache lines per access. For example, the DRAM chip 402f depicted in FIG. 7 can be implemented with less 'AND' gates to instead read out 16 cache lines per access (e.g., the SWLs become 16 times longer between 'AND' gates). Such an example implementation would still produce relatively high energy savings over known DRAM chips.

As discussed above, the SBA technique advantageously reduces energy consumption during memory accesses while enabling interfacing memory controllers with memories in accordance with current (and likely future) industry standards for interfacing with DRAM memories. Another example memory access technique referred to herein as Single Subarray Access (SSA) organizes the layout of DRAM chips and the mapping of data to the DRAM chips so that an entire processor cache line can be fetched from a single DRAM chip (e.g., one of the memory chips 202a-d of FIG. 2) of a memory module (e.g., the DRAM PCB in-line memory module 200 of FIG. 2). The SSA memory access techniques are described below in connection with FIGS. 8-13.

Unlike known techniques for accessing cache lines from a DRAM memory module, which involve activating every DRAM chip of the memory module and concatenating the data output from each DRAM chip to form a single cache line, the example SSA memory access techniques illustrated in FIGS. 8-13, 15, and 16 involve reading an entire requested cache line from a single DRAM chip (e.g., one of the memory chips 202a-d of FIG. 2) of a memory module (e.g., the DRAM PCB in-line memory module 200 of FIG. 2). In this manner, the SSA technique eliminates the need to activate every DRAM chip in a memory module when accessing a requested cache line.

Figure 8:
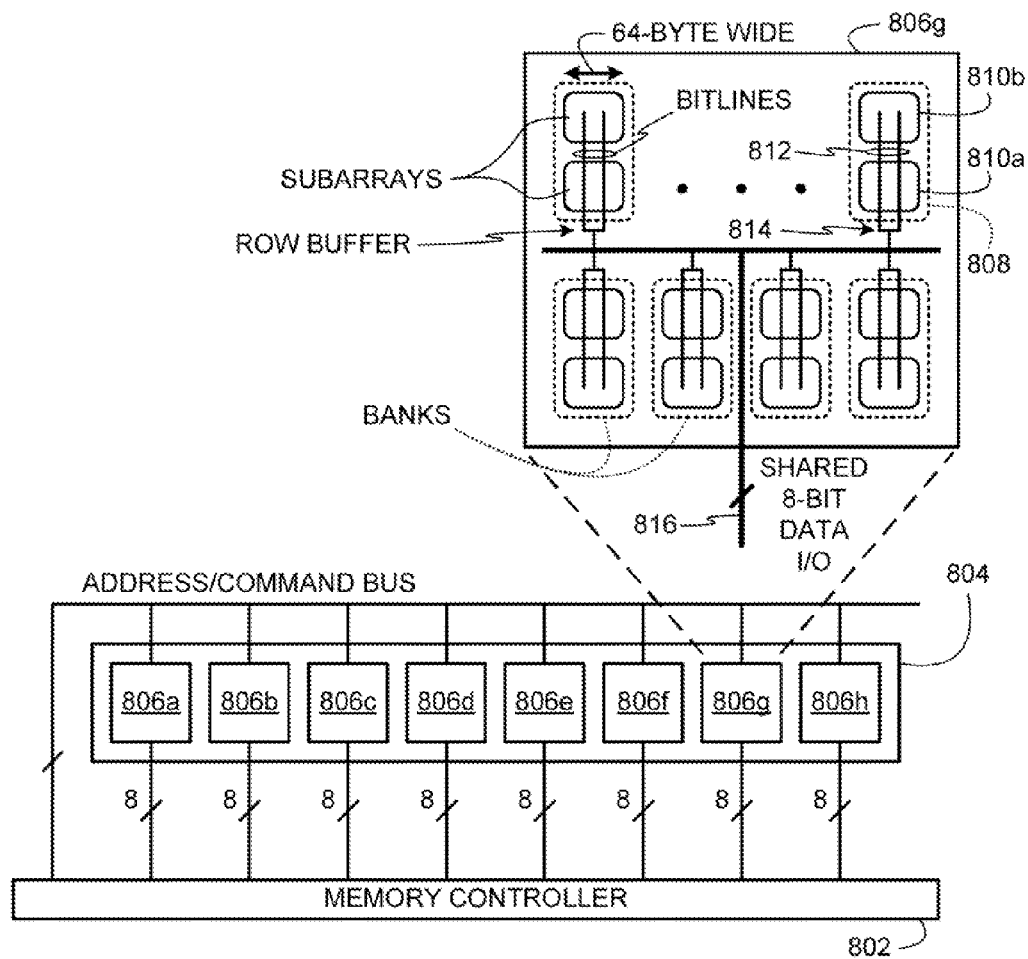
FIG. 8 is a diagram of a DRAM configuration to selectively activate a particular DRAM chip to access an entire cache line from that DRAM chip.

Turning to FIG. 8, a memory controller 802 is shown interfacing with a multi-chip DRAM memory module 804. In the illustrated example, the memory controller 802 is configured to access contents of the DRAM module 804 in accordance with the SSA technique described below. As shown, the DRAM module 804 includes eight DRAM chips 806a-h, each having an 8-bit output data bus. The DRAM chip 806g is shown in detail. The other DRAM chips 806a-f and 806h are substantially similar to the DRAM chip 806g and, thus, are not illustrated in detail. The DRAM chip 806g is provided with a plurality of banks, each bank having a plurality of subarrays and bitlines to access individual bit cells in the subarrays. For example, a bank 808 includes subarrays 810a and 810b, bitlines 812, and a row buffer 814. In the illustrated example, each subarray of the DRAM chip 806g is 64 bytes wide. Thus, each row of the subarrays 810a-b can store a contiguous 64-byte wide cache line of data. In contrast, known DRAM memory modules store a cache line as several cache line portions or segments among several DRAM chips on the same memory module. For example, a known memory module having eight DRAM chips stores a 64-byte cache line by dividing the cache line into eight segments (e.g., eight 8-byte segments). Each of the eight cache line segments is then stored in a separate, respective DRAM chip such that access to the 64-byte cache line requires enabling all eight DRAM chips at the same time. Unlike those known DRAM memory modules, each of the SDRAM chips 806a-h of the example of FIG. 8 can store whole, contiguous cache lines. In this manner, when a particular cache line is requested by the memory controller 802, only the DRAM chip that stores the entire requested cache line needs to be activated while the other DRAM chips can remain in a sleep mode or other low-power mode to prevent excess power consumption (e.g., prevent energy leakage).

As shown in FIG. 8, the DRAM chip 806g is provided with a shared 8-bit external data I/O bus 816. Thus, a 64-byte wide cache line in a subarray is accessed using multiple consecutive row accesses to the DRAM chip 806g. Each of the row accesses causes the bitlines 812 to perform 8-bit read outs (or write ins) of the subarray to/from the shared 8-bit external data I/O bus 816 until the entire cache line has been accessed. In the illustrated example, the addressing organization used by the memory controller 802 to access the contents of the DRAM chips 806a-h enables selectively enabling specific ones of the DRAM chips 806a-h and specifying particular rows of the enabled DRAM chips 806a-h. For example, as described in greater detail below in connection with FIGS. 9 and 10, a portion of an address communicated by the memory controller 802 function as chip selects to enable selecting a specific one of the DRAM chips 806a-h per memory access.

In the illustrated example of FIG. 8, the SSA architecture is used in combination with the SBA technique of activating only necessary circuitry in a DRAM chip per memory access discussed above. Thus, because entire cache lines are stored in respective banks and subarrays (e.g., the subarrays 810a-b of the bank 808), a memory access for a particular cache line requires a DRAM chip to activate only that portion of its circuitry that stores the requested cache line. For example, if the memory controller 802 requests a cache line stored in the subarray 810a, the DRAM chip 806g need only activate the circuitry for the bank 808 and the subarray 810a to retrieve the requested cache line, while maintaining the circuitry for the other banks and subarrays of the DRAM chip 806b (as well as the other DRAM chips 806a-f and 806h of the module 804) in a low-power mode. In this manner, a large portion of the accessed DRAM chip 802g as well as larger portions of the DRAM chips 806a-f and 806h can remain in a low-power mode while only some of the circuitry of the addressed chip (e.g., the DRAM chip 806g) is activated to retrieve a requested cache line. This approach realizes a significant power savings over known DRAM memory devices that require activating all banks during a memory access.

The SSA architecture can be used to dynamically reduce energy by activating a single chip and a single subarray (e.g., with short wordlines and the required quantity of bitlines) when accessing a cache line of memory. In addition, background energy can be reduced because a large fraction of on-chip die area is inactive at any point in time and can be placed in low-power modes, even when other portions (e.g., other subarrays and banks) of the memory are active. Also, the SSA architecture can be used to favorably impact performance by having relatively more banks per memory module and, thus, higher concurrency. For example, if each memory chip of a memory module has eight banks, the entire memory module has 64 separately accessible banks, each of which can store cache lines in their entireties. As such, performance can be positively impacted by adopting close-page access policies when there is low locality of stored data. In instances where there is high locality, the SSA architecture disclosed herein can be used in combination with probability techniques for approximating or estimating how row buffer hits can be used to issue prefetches to consecutive lines that may reside in other memory chips or banks.

In some examples, the SSA architecture of FIG. 8 is also configured to finish pre-charging a bank (e.g., the bank 808) when a corresponding DRAM chip (e.g., the DRAM chip 806g) closes a row or subarray in that bank. In this manner, any subsequent access to the same bank will begin faster than if the bank were not pre-charged in this manner.

Figure 9:
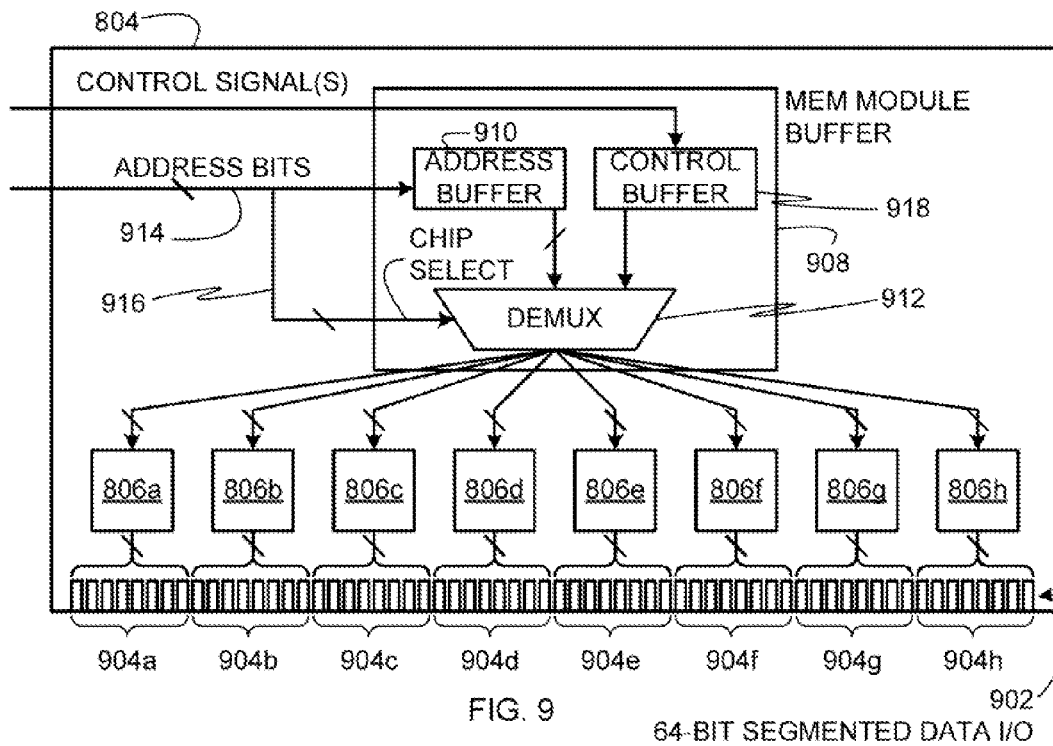
FIG. 9 is a detailed diagram of the DRAM module of FIG. 8.

FIG. 9 is a detailed diagram of the DRAM module 804 of FIG. 8 implemented as a PCB in-line DRAM memory module that can provide concurrent data access to all of its DRAM chips 806a-h. In the illustrated example of FIG. 9, the DRAM module 804 is provided with a 64-bit segmented data bus 902. The segmented data bus 902 is physically divided into eight separate 8-bit data buses 904a-h, each of which corresponds to a respective one of the DRAM chips 806a-h. Using the example configuration of FIG. 9, two or more of the DRAM chips 806a-h can concurrently read out separate cache lines to the memory controller 802 (FIG. 8).

To select specific ones of the DRAM chips 806a-h and specify storage locations therein, the DRAM memory module 804 is provided with a memory module buffer 908 having an address buffer 910 and a demultiplexer 912. In the illustrated example, the address buffer 910 is connected to an address bus 914, and the demultiplexer 912 is connected to at least three of the most significant bits (MSB) 916 of the address bus 914. In some example implementations, three bits other than the MSB bits may be used instead. The three MSBs 916 of the address bus 914 are used by the demultiplexer 912 as chip selects to enable a specified one of the eight DRAM chips 806a-h for each memory access. During a memory access, the address buffer 910 latches address bits communicated by the memory controller 802, and a portion of the address bits (e.g., the three MSBs 916) are latched by the demultiplexer 912. The demultiplexer 912 decodes the three MSBs 916 to enable a specified one of the DRAM chips 806a-h (e.g., the DRAM chips identified by the three MSBs 916) and communicates the address bits from the address buffer 910 to the specified one of the DRAM chips 806a-h. The specified one of the DRAM chips 806a-h can then provide access (e.g., read/write access) to an entire cache line stored therein at the address location specified by the address latched by the address buffer 910. For example, if a read operation accesses the DRAM chip 806g, the DRAM chip 806g reads out a 64-byte cache line by outputting 8-bits per read cycle on its 8-bit data bus 904g over multiple read cycles.

In the illustrated example, the memory module buffer 908 is also provided with a control buffer 918 to latch, buffer, or otherwise store one or more memory access control signals from the memory controller 802. An example control signal is a write enable signal. The one or more buffered control signals can also be communicated to respective ones of the DRAM chips 806a-h via the demultiplexer 912.

In the illustrated example of FIG. 9, because each of the DRAM chips 806a-h interfaces to a separate one of the data buses 904a-h, multiple ones of the DRAM chips 806a-h can output respective cache lines simultaneously. For example, multiple concurrent memory access requests communicated by the memory controller 802 (FIG. 8) to the memory module buffer 908 can be pipelined in the memory module buffer 908 and consecutively communicated to respective ones of the DRAM chips 806a-h. In this manner, each of the selected one of the DRAM chips 806a-h can concurrently read out a requested cache line via its respective one of the data buses 904a-h. In such example implementations, the memory controller 802 is configured to organize concurrently received cache lines and to communicate them to a processor's cache memory (e.g., the cache memory 114 of the processor 112 of FIG. 1) in a coherent manner.

Figure 10:
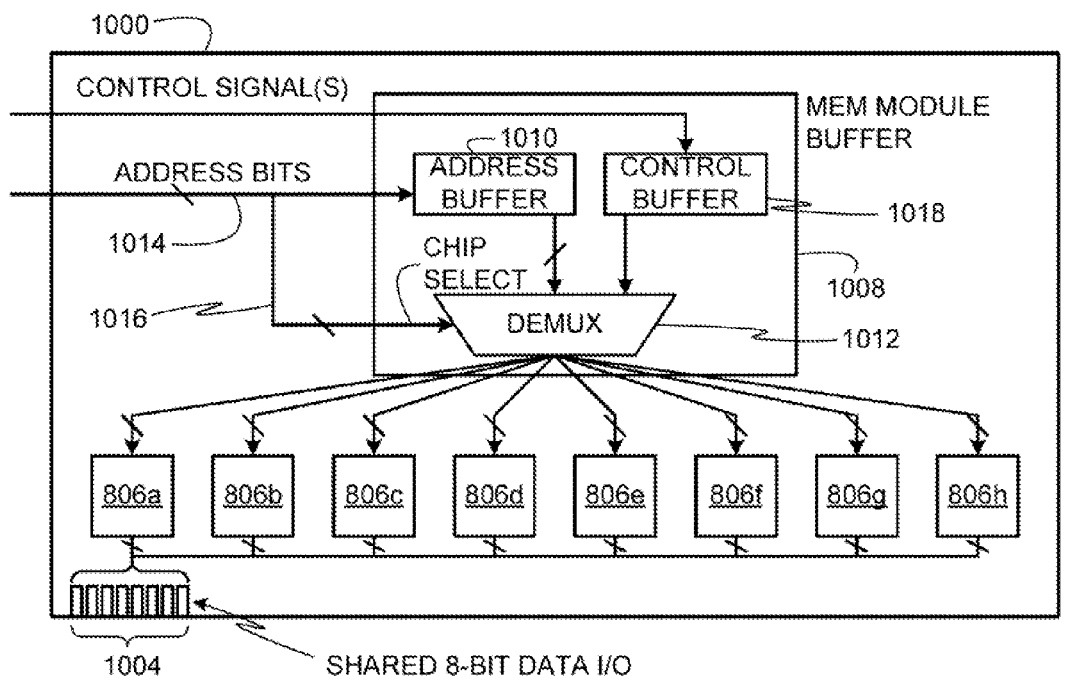
FIG. 10 is a diagram of another DRAM memory module that can alternatively be used to implement the DRAM module of FIG. 8 to provide data access to only a single DRAM chip at a time.

FIG. 10 is a diagram of an alternative multi-chip memory module structure 1000 that can be used to implement the DRAM module 804 of FIG. 8 to provide data access to only a single DRAM chip at a time (e.g., a single one of the DRAM chips 806a-h per cache line readout). In the illustrated example of FIG. 10, the DRAM module 1000 is provided with a shared one-chip wide data bus 1004, which is shown by way of example as an 8-bit wide data bus. The shared one-chip wide data bus 1004 is used by each of the DRAM chips 806a-h, one chip at a time. Using the example configuration of FIG. 10, only one of the DRAM chips 806a-h can read out data to the memory controller 802 (FIG. 8) per read out cycle.

To select specific ones of the DRAM chips 806a-h and specify storage locations therein, the DRAM memory module 1000 is provided with a memory module buffer 1008 having an address buffer 1010 and a demultiplexer 1012. In the illustrated example, the address buffer 1010 is connected to an address bus 1014, and the demultiplexer 1012 is connected to at least three of the most significant bits (MSB) 1016 of the address bus 1014. The three MSBs 1016 of the address bus 1014 are used by the demultiplexer 1012 as chip selects to enable a specified one of the eight DRAM chips 806a-h for each memory access. In addition, the memory module buffer 1008 is also provided with a control buffer 1018 to latch, buffer, or otherwise store one or more memory access control signals (e.g., a write enable signal) from the memory controller 802.

During a memory access, the address buffer 1010 latches address bits communicated by the memory controller 802, and a portion of the address bits (e.g., the three MSBs 1016) are used by the demultiplexer 1012. In addition, the control buffer 1018 latches one or more control signals. The demultiplexer 1012 decodes the three MSBs 1016 (or other three selected bits instead of the three MSBs) to enable a specified one of the DRAM chips 806a-h and communicates the address bits from the address buffer 1010 and the control signal(s) from the control buffer 1018 to the specified one of the DRAM chips 806a-h. The three MSBs 1016 can, thus, be thought of as selecting the output of the demultiplexer 1012 to which the remaining address bits are routed. The specified one of the DRAM chips 806a-h can then provide access (e.g., read/write access) to an entire cache line stored therein at the address location specified by the address latched by the address buffer 1010. For example, if a read operation accesses the DRAM chip 806g, the DRAM chip 806g reads out a 64-byte cache line by outputting 8-bits per read cycle on the shared one-chip wide data bus 1004 over multiple read cycles.

Figure 11:
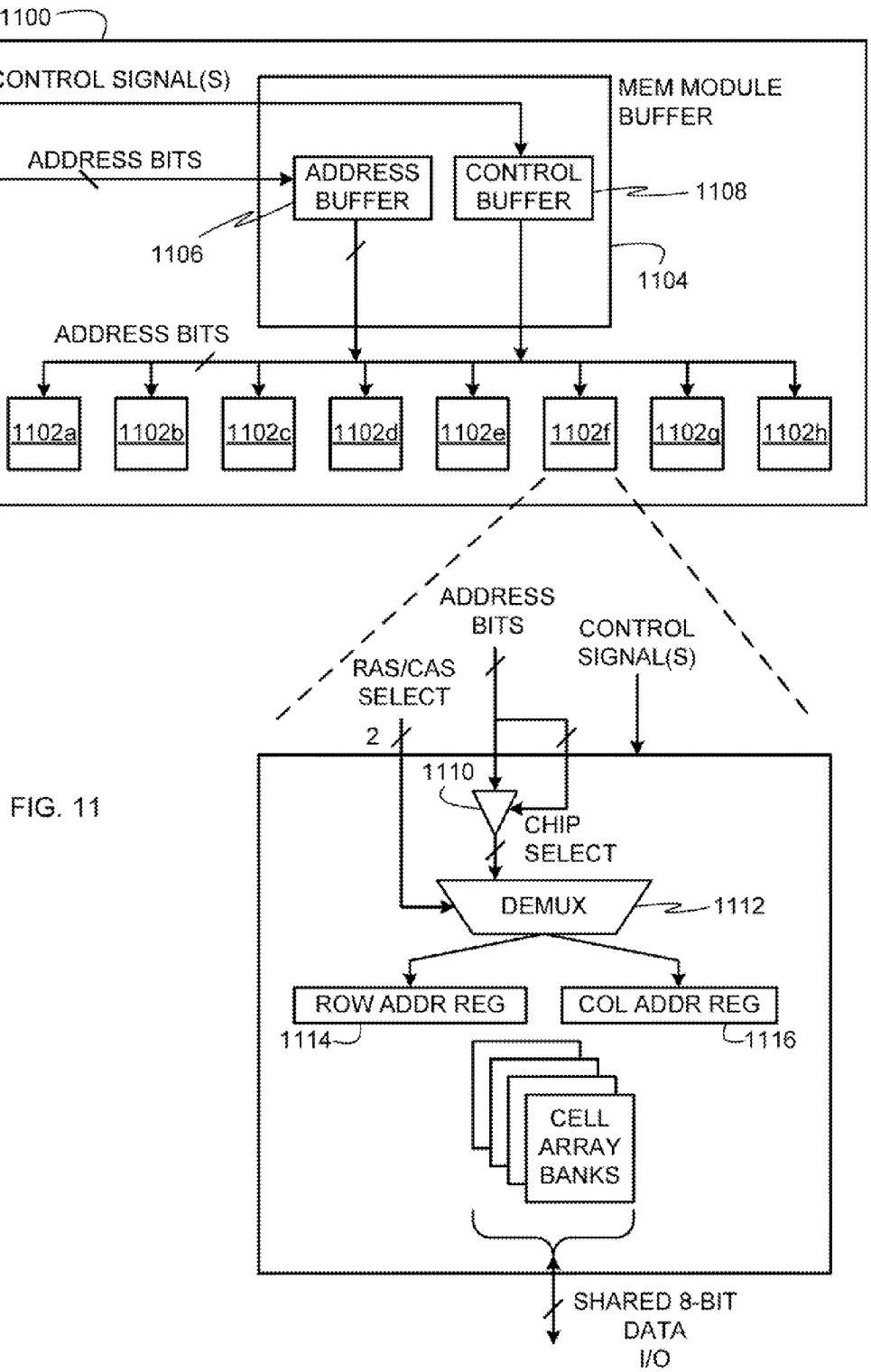
FIG. 11 is a diagram of another DRAM memory module that can alternatively be used to implement the DRAM module of FIG. 8 to selectively activate particular DRAM chips per memory access.

FIG. 11 is a diagram of another multi-chip DRAM memory module 1100 that can be used to implement the DRAM module 804 of FIG. 8 to selectively activate particular DRAM chips 1102a-h per memory access in accordance with SSA techniques. The DRAM memory module 1100 can be implemented as a PCB in-line memory module or any other type of memory module. In addition, a data bus (not shown) of the DRAM memory module 1100 can be implemented as a segmented data bus such as the segmented data bus 902 of FIG. 9 to enable concurrent memory access in separate ones of the DRAM chips 1102a-h, or the data bus may be implemented as a shared one-chip wide data bus such as the shared one-chip data bus 1004 of FIG. 10, or the data bus may be implemented using some combination thereof.

In the illustrated example of FIG. 11, the DRAM memory module 1100 is provided with a memory module buffer 1104 having an address buffer 1106 and a control buffer 1108. Upon receiving an address from a memory controller (e.g., the memory controller 802 of FIG. 8), the address buffer 1106 latches the address bits and communicates the address in broadcast fashion to all of the DRAM chips 1102a-h, unlike the example implementations of FIGS. 9 and 10, in which the respective memory module buffers 908 and 1008 use chip selects and demultiplexers to selectively communicate an address to only a relevant DRAM chip. In addition, the control buffer 1108 latches one or more control signal(s) (e.g., write enable control signals) and also communicates the control signal(s) in broadcast fashion to all of the DRAM chips 1102a-h. In the illustrated example of FIG. 11, each of the DRAM chips 1102a-h is configured to determine whether received addresses specify their storage locations or whether addresses can be ignored. When a DRAM chip determines that it can ignore an address, it can remain in a sleep mode or other low-power mode. When a DRAM chip determines that an address is relevant, the DRAM chip is activated and provides access to the specified memory contents.

In some examples the memory module buffer 1104 may be omitted and memory module buffers substantially similar or identical to the memory module buffer 1104 may be implemented in each of the DRAM chips 402a-h such that the memory module 1100 operates the same as if it were provided with the memory module buffer 1104 as shown in FIG. 11.

In the illustrated example of FIG. 11, DRAM chip 1102f is shown in detail. The other DRAM chips 1102a-e, 1102g, and 1102h are substantially similar in structure and operation to the DRAM chip 1102f and, thus, to avoid redundancy, are not illustrated. To determine whether to decode or ignore received addresses, the DRAM chip 1102f is provided with a tri-state buffer 1110 that receives address bits from the address buffer 1106 and uses a portion of the address bits (e.g., the MSBs) as a chip select input. The DRAM chip 1102f uses the chip select input of the tri-state buffer 1110 to determine whether received addresses are relevant. By providing the tri-state buffer 1110, the DRAM chip 1102f can be selectively activated to provide access to an entire requested cache line stored therein.

If the chip select input of the tri-state buffer 1110 enables the DRAM chip 1102f, the tri-state buffer 1110 communicates the address to a demultiplexer 1112, which is configured to identify whether received address bits correspond to row addresses or column addresses based on assertions of RAS/CAS signals. The DRAM chip 1102f is configured to store received row addresses in a row address register 1114 and received column addresses in a column address register 1116 before decoding the addresses and activating a corresponding storage area. In the illustrated example of FIG. 11, once the DRAM chip 1102f is activated or selected based on the provided address information, the DRAM chip 1102f is configured to act on one or more control signal(s) from the control buffer 1108 and decode the row and column addresses to selectively activate specific storage areas (e.g., SWLs) as discussed above in connection with FIGS. 4, 6, and 7 to provide access to the requested data.

Figure 12:
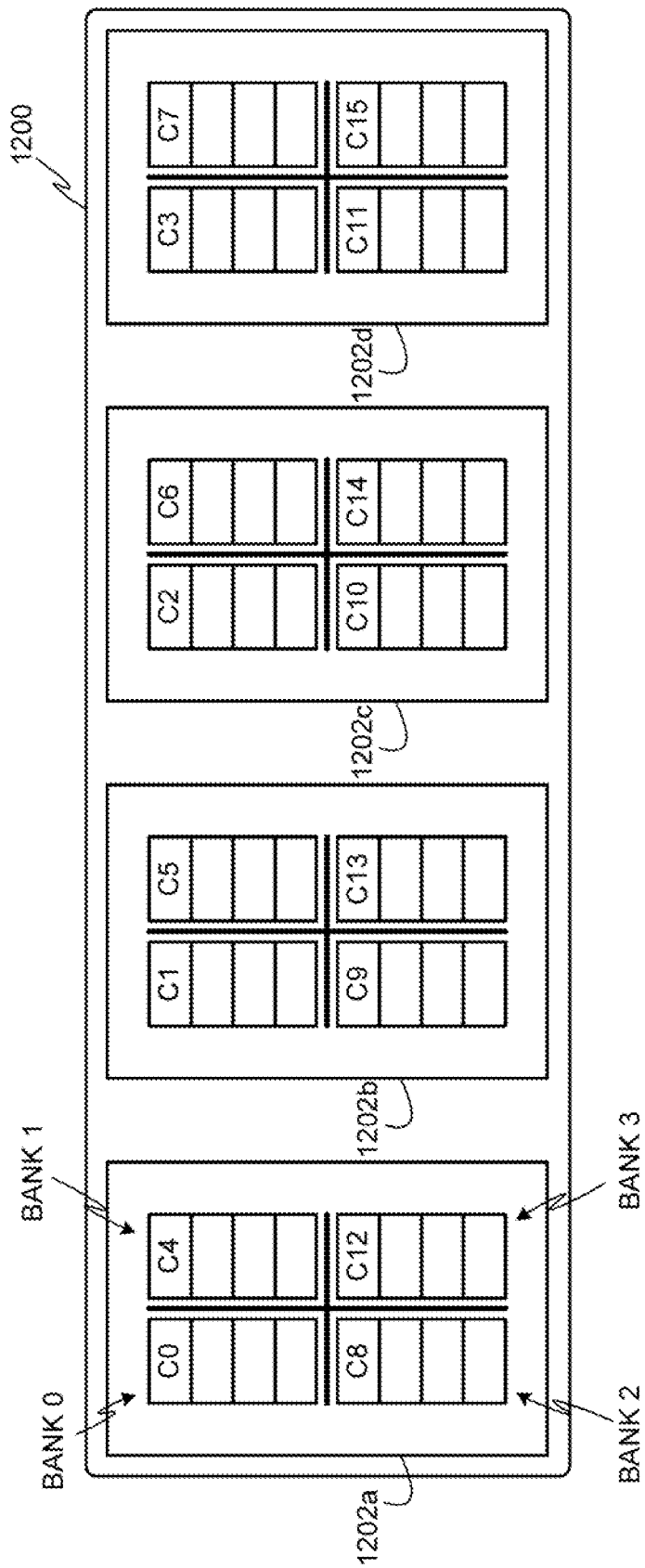
FIG. 12 is an example cache line storage configuration that can be used in connection with the example DRAM memory modules of FIGS. 8-11.

FIG. 12 illustrates an example cache line storage configuration that can be used in connection with any of the example DRAM memory modules of FIGS. 8-11. In the illustrated example, four DRAM chips 1202a-d of a multi-chip memory module 1200 are shown. In the illustrated example, to distribute load and increase concurrency, data is interleaved between the DRAM chips 1202a-d such that consecutive cache lines are first placed in different ones of the DRAM chips 1202a-d and then in different banks of each DRAM chip. In the illustrated example, each of the DRAM chips 1202a-d includes four banks. The DRAM chip 1202a is shown as having banks 0-3. Cache lines C0-C15 are distributed among the different DRAM chips 1202a-d and different ones of the respective banks of the DRAM chips 1202a-d in a chip-bank-interleaved fashion using the least significant bits (LSBs) of a cache line address as bank select lines. For example, cache line C0 is stored in bank 0 of the DRAM chip 1202a and cache line C1 is stored in bank 0 of the DRAM chip 1202b. When a last DRAM chip is reached (e.g., the DRAM chip 1202d), the next sequential cache line is stored in a sequentially next bank of the first DRAM chip. For instance, as shown in FIG. 12, cache line C3 is stored in bank 0 of the DRAM chip 1202d and cache line C4 is stored in bank 1 of the DRAM chip 1202a.

Figure 13:
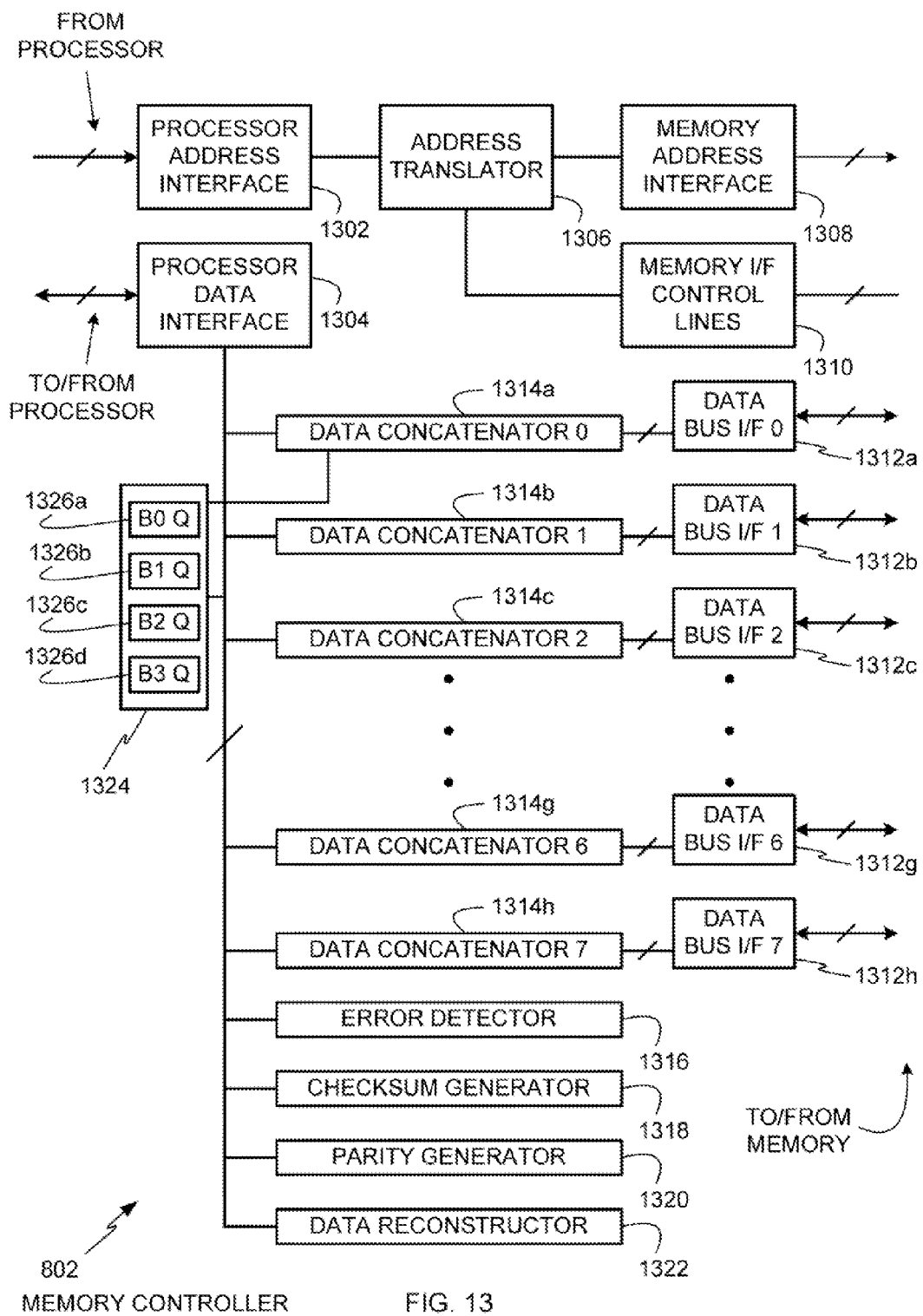
FIG. 13 depicts a detailed diagram of a memory controller of FIG. 8.

FIG. 13 is a detailed diagram illustrating the example memory controller 802 of FIG. 8. The memory controller 802 is configured to be connected between a processor (e.g., the processor 112 of FIG. 1) and one or more memory devices (e.g., the memory modules of FIGS. 8-11). In some example implementations, the memory controller 802 can be implemented as a standalone IC chip separate from a processor chip. Alternatively, the memory controller 802 may be formed on the same die or located in the same IC package as a processor. In the illustrated example, a single address bus and a single command line bus are used to communicate with all DRAM chips on a memory module.

The memory controller 802 can be configured to provide an address in two transfers. This is particularly advantageous when pin limitations arise for a memory module or an IC package of the memory controller 802. Such a two-transfer address is similar to transferring separate row and column addresses in a conventional manner. However, the address transfers of the memory controller 802 need not necessarily correspond to row and column addresses. As discussed above in connection with FIG. 8, cache lines are stored in DRAM chips using a bank/subarray arrangement, which is a different organization from row/column arrangements in known DRAM chips. Thus, the cache lines can be addressed using a single address that is transferred by the memory controller 802 to a memory module in two separate address cycles. In the illustrated example, the address bits from both transfers identify a unique subarray (e.g., one of the subarrays 810a or 810b) and row (i.e., a cache line) within that subarray. Therefore, an entire address is required before a subarray can be identified or accessed. In addition, a portion of the address (e.g., the MSBs of the address) identifies the DRAM chip that stores the requested cache line, and that portion of the address can be used as a chip select as discussed above in connection with FIGS. 9-11 to activate a corresponding DRAM chip storing the requested cache line.

In the illustrated example of FIG. 13, the memory controller 802 includes a processer address interface 1302 and a processor data interface 1304, each of which is configured to communicate with a processor (e.g., the processor 112 of FIG. 1). To translate addresses received from a processor into address and control bits to access memory contents in a memory module (e.g., the memory modules of FIGS. 9-12), the memory controller 802 is provided with an address translator 1306. For example, the address translator 1306 can split an address into two separately transferrable portions so that a lengthy address can be transferred to a memory module using two separate address transfers via a memory address interface 1308. To facilitate a two-transfer address, the address translator 1306 can cause memory interface control lines 1310 to assert corresponding control signal lines to inform a memory module of the ordering of the address transfers. For example, a first address transfer signal (not shown) of the memory interface control lines 1310 can be asserted to indicate that a first portion of an address is being output by the memory address interface 1308, while a second address transfer signal can be asserted to indicate that a second portion of an address is being output by the memory address interface 1308.

In some example implementations, in which virtual-to-physical address memory translation is performed as part of memory controller operations, the address translator 1306 can also translate addresses between a virtual memory map used by the processor and a physical memory map corresponding to the addressing scheme of physical memory modules connected to the memory controller 802. In some example implementations, the address translator 1306 may also update a physical memory map when information is stored in or deleted from memory. If virtual-to-physical memory address translation is not performed as part of memory controller operations, such memory address translations can be performed in a processor.

To transfer data between the memory controller 802 and memory modules, the memory controller 802 is provided with one or more data buses. In the illustrated example, the memory controller 802 is provided with eight separate, narrow channel, data bus interfaces 1312*a-h*. In this manner, the memory controller 802 can access entire cache lines from respective individual DRAM chips as discussed above in connection with. FIGS. 8-12 using respective data bus interfaces 1312*a-h*. In the illustrated example, each of the data bus interfaces 1312*a-h* includes eight data lines. In some example implementations, the memory controller 802 may be provided with a single narrow channel data bus when configured to interface with memory modules having a corresponding single narrow channel data bus such as the shared one-chip data bus 1004 of FIG. 10.

To concatenate cache line segments to form entire cache lines, the memory controller 802 is provided with data concatenators 1314*a-h*. Each of the data concatenators 1314*a-h* may be implemented using a shift register that receives a number of bits at a time equal to the width of one of the data bus interfaces 1312*a-h* and shifts the bits per read access until a complete cache line is formed. The data concatenators 1314*a-h* can communicate their cache lines to the processor data interface 1304 for communication to a processor. In the illustrated example, the data concatenators 1314*a-h* can operate as queues for data to be communicated to a processor, and the processor data interface 1304 can arbitrate communications from the data concatenators 1314*a-h* to communicate cache lines to the processor in an order expected by the processor.

In some examples, the memory controller 802 is provided with separate data queues for each bank in a DRAM chip (e.g., each of the DRAM chips 1102*a-h* of FIG. 11). For example, as shown in FIG. 13, the data concatenator 0 1314*a* is connected to a data queue array 1324 having separate data queues for each bank of a DRAM chip corresponding to the data concatenator 0 1314*a*. In particular, the data queue array 1324 includes a B0 queue 1326*a* for a first bank of an SDRAM chip, a B1 queue 1326*b* for a second bank of the SDRAM chip, a B2 queue 1326*c* for a third bank of the SDRAM chip, and a B3 queue 1326*d* for a fourth bank of the SDRAM chip. In the illustrated example, the bank queues 1326*a-d* are configured to hold or queue data received from an SDRAM chip for subsequently forwarding to a processor. In the illustrated example, the bank queues 1326*a-d* enable buffering data that is received faster than it can be communicated to a requesting processor. In this manner, requested data can be quickly received at the memory controller 802 from a memory so that the memory can be freed-up to service other memory requests. Although not shown in FIG. 13, each of the other data concatenators 1314*b-h* is also provided with a respective data queue array substantially similar or identical to the data queue array 1324. That is, in the illustrated example, the quantity of bank queues (substantially similar or identical to the bank queues 1326*a-d*) provided in the memory controller 802 is equal to the number of banks in a single DRAM chip multiplied by the number of DRAM chips in a memory module (e.g., the memory module 1100 of FIG. 11).

To enable error detection and correction in connection with memory accesses, the memory controller is provided with an error detector 1316, a checksum generator 1318, a parity generator 1320, and a data reconstructor. 1322. The memory controller 802 of the illustrated example uses the error detector 1316 to verify checksums stored in association with cache lines in memory chips as discussed below in connection with FIGS. 17 and 18 and detect errors in stored information. That is, when an error exists in a data storage location storing some or all of a cache line (e.g., a cache line 1704 of FIG. 17), the error is exposed by checksum information (e.g., a checksum 1706 of FIG. 17) corresponding to the cache line and the error detector 1316 is configured to detect the error based on the checksum information. The memory controller 802 of the illustrated example uses the checksum generator 1318 to generate new checksums each time the memory controller 802 writes data to a memory. The memory controller 802 of the illustrated example uses the parity generator 1320 to generate updated parity values each time the memory controller 802 writes data to a memory. The memory controller 802 of the illustrated example uses the data reconstructor 1322 to reconstruct uncorrupted data when the error detector 1316 detects an error in a cache line based on corresponding checksum information exposing the error. The storage locations of checksum and parity values may be stored in a physical memory map in association with storage locations of their respective cache lines.

Figure 14:
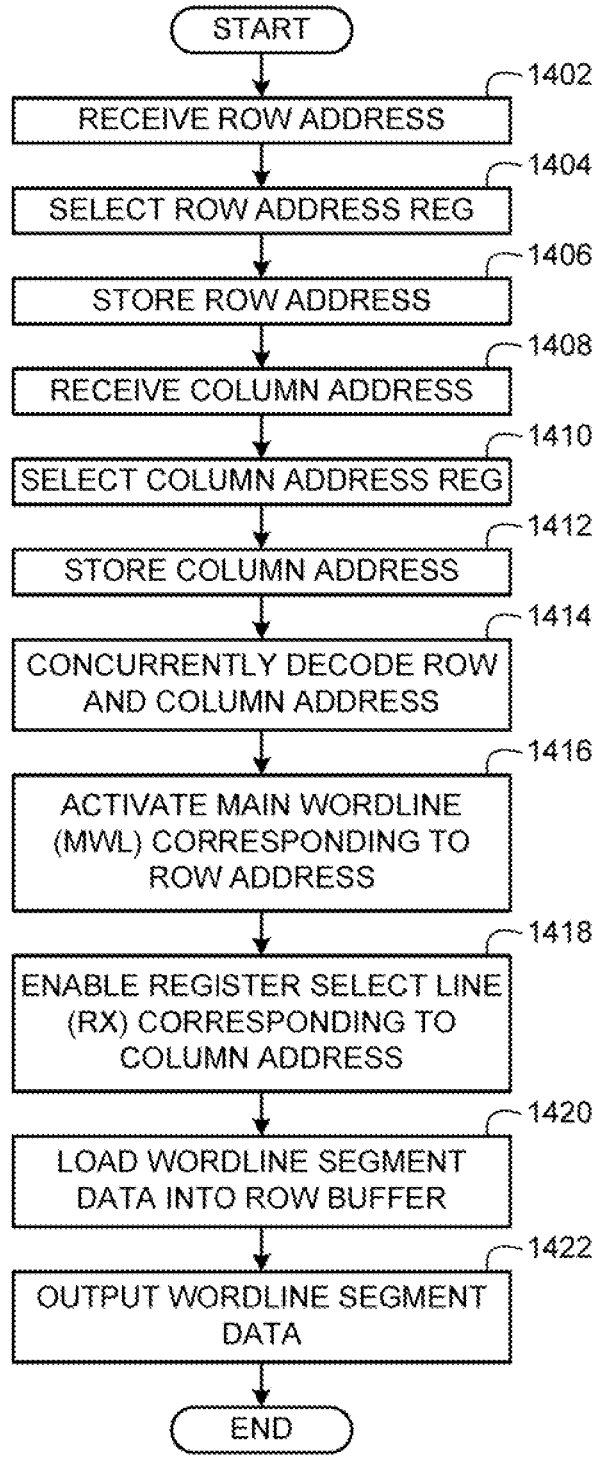
FIG. 14 depicts a flow diagram of an example process that can be used to access memory devices as described in connection with FIGS. 4, 6, and 7.

FIG. 14 is a flow diagram illustrating an example process that can be used to perform SBA memory accesses as described above in connection with FIGS. 4, 6, and 7. The example process of FIG. 14 is described below as performed by a single DRAM chip (e.g., the DRAM chip 402*f* of FIGS. 4, 6, and 7). However, the same process may be implemented in similar manner by any of the DRAM chips 402*a-h* of the memory module 400 (FIG. 4) or DRAM chips of other memory structures. Initially, the DRAM chip 402*f* receives a row address (block 1402), selects the row address register 412 (FIG. 4) (block 1404), and stores the row address (block 1406) in the row address register 412. For example, the DRAM chip 402*f* can select the row address register 412 based on an assertion of a RAS signal received at the demultiplexer 416.

The DRAM chip 402*f* receives a column address (block 1408), selects the column address register 414 (FIG. 4) (block 1410), and stores the column address (block 1412) in the column address register 414. The row decoder 604 and column decoder 606 (FIGS. 6 and 7) concurrently decode the row and column addresses (block 1414). The row decoder 604 activates a MWL (e.g., one of the MWL0 line 704 or MWL1 line 706 of FIG. 7) corresponding to the row address (block 1416). The column decoder 606 enables a RX line (e.g., one of the RX-0, RX-1, . . . RX-N 'AND' gates) corresponding to the column address (or a portion of the column address) (block 1418). By activating the MWL at block 1416 and one of the RX lines at block 1418, a SWL 'AND' gate (e.g., the SWL 'AND' gate 712 of FIG. 7) outputs a high signal to enable a requested wordline segment of data (e.g., the wordline segment 610 of FIGS. 6 and 7). The row buffer 612 (FIG. 6) loads the activated wordline segment data 610 (block 1420), and the data I/O buffer 614 (FIGS. 6 and 7) outputs the wordline segment data 610 (block 1422). The example process of FIG. 14 is then ended.

Figure 15:
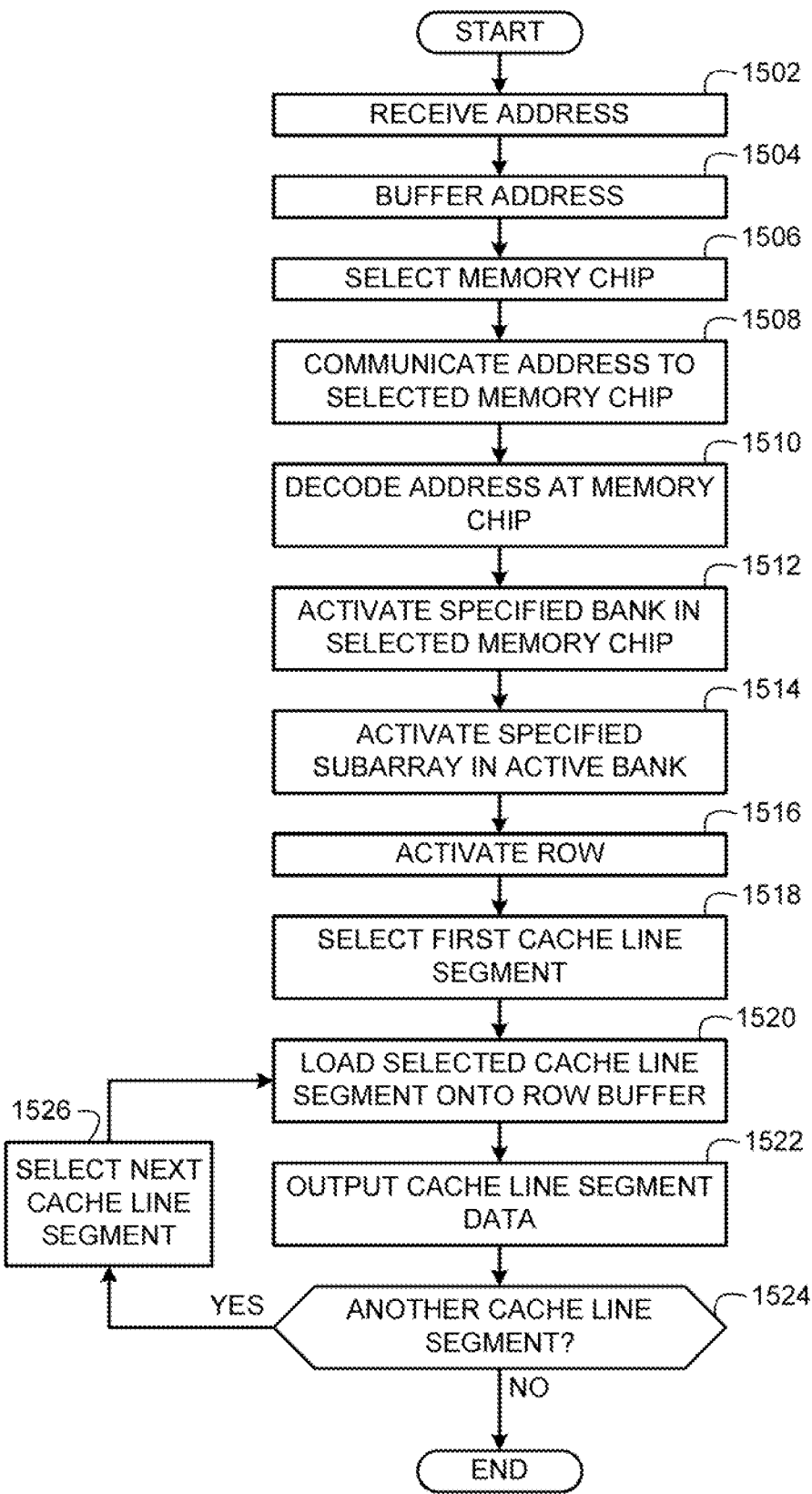
FIG. 15 depicts a flow diagram of an example process that can be used to access memory devices as described in connection with FIGS. 8-10, 12, and 13.

FIG. 15 is a flow diagram illustrating an example process that can be used to perform SSA memory accesses as described above in connection with FIGS. 8-10, 12, and 13. The example process of FIG. 15 is described below as performed by the memory module 800 of FIG. 8. However, the same process may be implemented in similar manner by any of the other memory modules depicted in FIGS. 9-10 or other memory structures. Initially, the memory module 800 receives an address (block 1502), and the address buffer 910 (FIG. 9) stores the address (block 1504). For example, as discussed above, the address can be received in two address transfers and concatenated by the address buffer 910 for communication to a corresponding one of the DRAM chips 806a-h.

The demultiplexer 912 then selects one of the DRAM chips 806a-h corresponding to the received address (block 1506). For example, the dumultiplexer 912 decodes a portion (e.g., the MSBs) of the address bits communicated across the address bus 914 to select a corresponding one of the DRAM chips 806a-h. The demultiplexer 912 then communicates the address from the address buffer 910 to the selected one of the DRAM chips 806a-h (block 1508). In some example implementations, the address from the address buffer 910 can be communicated in two transfers to a selected DRAM chip if the number of address bits exceeds the pin count of the address interface of the DRAM chip.

The selected one of the DRAM chips (e.g., the DRAM chip 806g) decodes the received address (block 1510) and activates a bank (e.g., the bank 808 of FIG. 8) (block 1512) specified by the address and a subarray (e.g., one of the subarrays 810a or 810b) in the active bank that is also specified by the address (block 1514). The DRAM chip 806g then activates a row (block 1516) also specified by the address and selects a first cache line segment (block 1518) of the cache line stored in the active row. A cache line segment is a sub-group of bits that form a portion of an entire cache line. Thus, if a cache line is 64 bytes wide, a cache line segment can be 8 bytes wide so that the 64-byte cache line can be read out using multiple 8-bit read cycles.

The row buffer 814 (FIG. 8) loads the selected cache line segment data (block 1520), and the shared 8-bit external data I/O bus 816 outputs the selected cache line segment data (block 1522). If there is another cache line segment remaining (e.g., another segment of a 64-byte wide cache line) (block 1524), the DRAM chip 806g selects the next cache line segment (block 1526) and control returns to block 1520. When no other cache line segments remain to be output (block 1524), this signifies that the DRAM chip 806g has completed reading out an entire cache line. In some examples, the DRAM chip 806g closes the active row (or subarray) and finishes pre-charging the bank in which the row (or subarray) is located to enable subsequent accesses to the same bank to begin faster than if the bank were not pre-charged in this manner. The example process of FIG. 15 is then ended.

Figure 16:
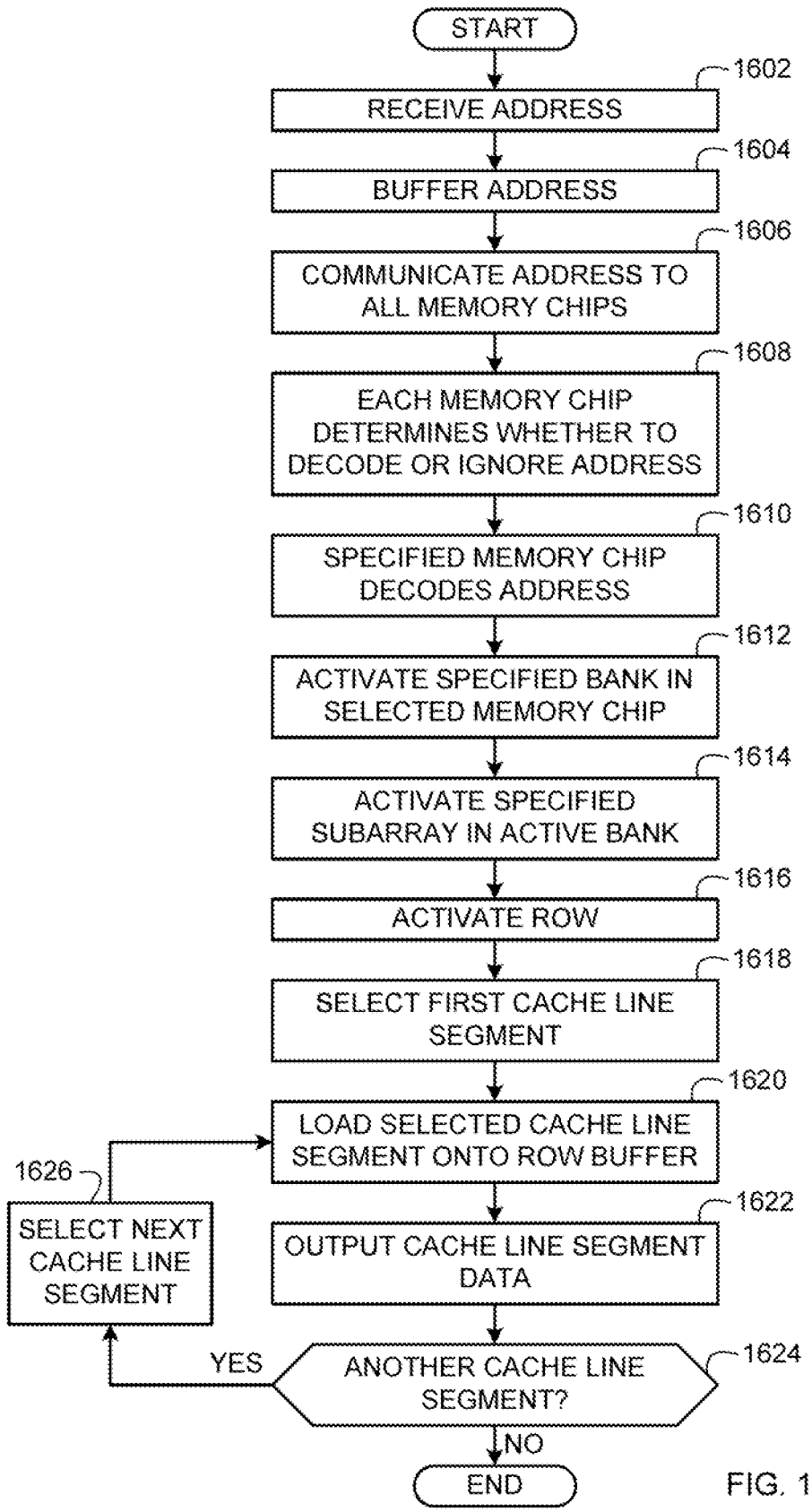
FIG. 16 depicts a flow diagram of an example process that can be used to access memory devices as described in connection with FIG. 11.

FIG. 16 is a flow diagram illustrating an example process that can be used to perform SSA memory accesses as described above in connection with FIG. 11. The example process of FIG. 16 is described below as performed by the memory module 1100 of FIG. 11; however, other memory structures could be used. Initially, the memory module 1100 receives an address (block 1602), and the address buffer 1106 (FIG. 11) stores the address (block 1604). For example, as discussed above, the address can be received in two address transfers and concatenated by the address buffer 1106 for communication to the DRAM chips 1102a-h.

The memory module buffer 1104 (FIG. 11) communicates the address from the address buffer 1106 to all of the DRAM chips 1102a-h (block 1606). In some example implementations, the address from the address buffer 1106 can be communicated in two transfers to the DRAM chips 1102a-h if the number of address bits exceeds the pin count of the address interface of the DRAM chips 1102a-h.

Each of the DRAM chips 1102a-h determines whether to decode or ignore the received address (block 1608). For example, as discussed above in connection with FIG. 11, the tri-state buffer 1110 of the DRAM chip 1102f can decode a portion (e.g., the MSBs) of the address as if it were a chip select to determine whether the DRAM chip 1102f is intended to act upon the received address.

The DRAM chip specified by the address (e.g., the DRAM chip 1102f) decodes the address (block 1610). The specified DRAM chip activates a bank (e.g., the bank 808 of FIG. 8) (block 1612) specified by the address and a subarray (e.g., one of the subarrays 810a or 810b) in the active bank that is also specified by the address (block 1614). The addressed DRAM chip then activates a row (block 1616) also specified by the address and selects a first cache line segment (block 1618) of the cache line stored in the active row. A cache line segment is a sub-group of bits that form part of an entire cache line. Thus, if a cache line is 64 bytes wide, a cache line segment can be 8 bytes wide so that the 64-byte cache line can be read out using multiple 8-bit read cycles.

A row buffer (e.g., the row buffer 814 of FIG. 8) of the addressed DRAM chip loads the selected cache line segment data (block 1620). A shared 8-bit external data 110 bus of the addressed DRAM chip outputs the selected cache line segment data (block 1622). If there is another cache line segment remaining (e.g., another segment of a 64-byte wide cache line) (block 1624), the addressed DRAM chip selects the next cache line segment (block 1626) and control returns to block 1620. When no other cache line segments remain to be output (block 1624) (i.e., the addressed DRAM chip has completed reading out an entire requested cache line), the example process of FIG. 16 is ended. In some examples, the addressed DRAM chip closes the active row (or subarray) and finishes pre-charging the bank in which the row (or subarray) is located to enable subsequent accesses to the same bank to begin faster than if the bank were not pre-charged in this manner.

Figure 17:
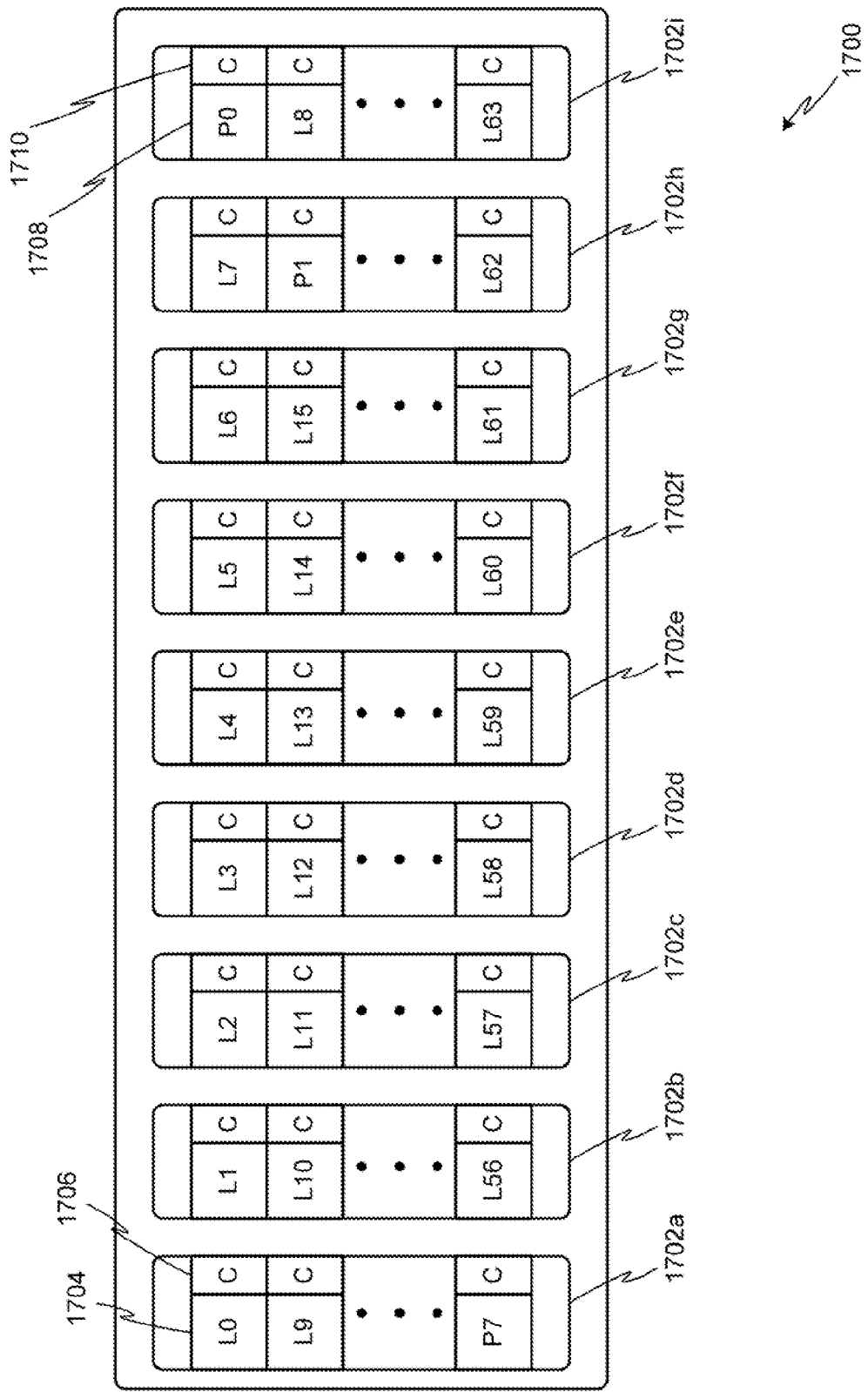
FIG. 17 depicts an example memory module configured to store error-checking and parity information to enable error-checking and data correction operations when accessing data stored therein.

FIG. 17 depicts an example multi-chip memory module 1700 configured to store error-checking and parity information to enable error-checking and data correction operations when accessing data stored therein. In the illustrated example, the memory module 1700 includes nine memory chips 1702a-i. The memory module 1700 can be advantageously used to implement memory modules that enable SSA memory accesses as described above in connection with FIGS. 8-13, 15, and 16. That is, the memory structures described above in connection with FIGS. 8-12 enable retrieving an entire cache line from a single DRAM chip. To facilitate detecting corrupted cache lines, the memory module 1700 stores checksums in association with each stored cache line. In addition, to facilitate reconstructing corrupted cache lines, the memory module 1700 stores parity information among all of the memory chips 1702a-i.

In the illustrated example of FIG. 17, the architecture of the memory module 1700 is adapted so that each of the memory chips 1702a-i can store entire cache lines and a corresponding checksum for each cache line. In FIG. 7, a cache line L0 1704 is stored by the first memory module 1702a in association with a corresponding checksum (C) 1706. Storing a respective checksum for each cache line in this manner requires additional storage space of the memory module 1700. For example, storing an 8-byte checksum for each 64-byte cache line incurs a 1.625% storage overhead. To retrieve a cache line (e.g., the cache line L0 1704) and its corresponding checksum (e.g., the checksum (C) 1706), a larger burst length can be used. For example, nine 8-byte data reads can be used to retrieve a 64-byte cache line and its 8-byte checksum rather than using only eight 8-byte data reads to retrieve only the 64-byte cache line. Similarly, nine 8-byte data writes can be used to write a 64-byte cache lines and its checksum to a corresponding storage location.

In the illustrated example of FIG. 17, the memory module 1700 stores a parity value corresponding to eight cache lines. To accommodate the additional storage required for parity information, the memory module 1700 is provided with nine memory modules 1702a-i instead of only eight memory modules. The parity values are stored among different ones of the memory chips 1702a-i. For example, as shown in FIG. 17, a parity value PO 1708 corresponding to cache lines L0-L7 is stored in the memory module 1702i. Further, the parity value PO 1708 is stored in association with a checksum (C) 1710 corresponding to the parity value PO 1708. When an error is detected in a retrieved cache line, an uncorrupted cache line can be reconstructed by reading a corresponding parity value and the other cache lines corresponding to that parity value. For example, if an error is detected upon reading the cache line L0 1704, an uncorrupted instance can be reconstructed (e.g., by the data reconstructor 1322 of FIG. 13) based on the parity value PO 1708 and cache lines L1-L7 using, for example, known reconstruction techniques associated with the redundant array of inexpensive disks (RAID) techniques of RAID-4 and/or RAID-5 data reconstruction processes.

During a read access, checksum verification can be performed by a memory controller such as the memory controller 802 of FIG. 13. For example, a checksum verification function can be performed by the error detector 1316 (FIG. 13) using bit inversion to ensure detection of stuck-at-zero faults. If an error is detected, the data reconstructor 1322 (FIG. 13) can reconstruct the requested cache line based on the stored parity information. To enable the checksum verification, during a read access of data at a storage location an additional burst is employed (e.g., during the same read cycle as the read access of the data) by the memory module 1700 to also read out a corresponding checksum value to enable the error detector 1316 (FIG. 13) of the memory controller 802 to perform the checksum verification. For example, while servicing a read request of the cache line L0 1704, the memory chip 1702a reads out the requested cache line L0 1704 and uses an additional burst to also read out the checksum value 1706 corresponding to the cache line L0 1704. In this manner, the memory chip 1702a provides the requested data and the corresponding stored checksum to the requesting memory controller 802 to detect any errors that may exist in the requested data. In the illustrated example, the memory controller 802 reads in cache lines (data), checksums, and parity values via the data bus interfaces 1312a-g (FIG. 13).

During a write access, the memory controller 802 writes a cache line and corresponding checksum to their designated addressed location in a memory chip (e.g., one of the memory chips 1702a-i). In addition, the memory controller 802 writes an updated parity value corresponding to the written cache line. To perform such a write operation, the memory controller 802 must first read out the old cache line (e.g., the cache line L0 1704) and checksum (e.g., the checksum 1706) from the memory chip (e.g., the memory chip 1702a), read out the old corresponding parity value (e.g., the parity value PO 1708) from the memory chip, write the new cache line and checksum (in replacement of the old cache line and checksum), and write the corresponding updated parity value (in replacement of the old parity value). For each write operation, the memory controller 802 can use the checksum generator 1318 (FIG. 13) to generate new checksum values and use the parity generator 1320 (FIG. 13) to generate new parity values. In the illustrated example, the memory controller 802 reads in and writes out cache lines (data), checksums, and parity values via the data bus interfaces 1312a-g (FIG. 13).

Figure 18:
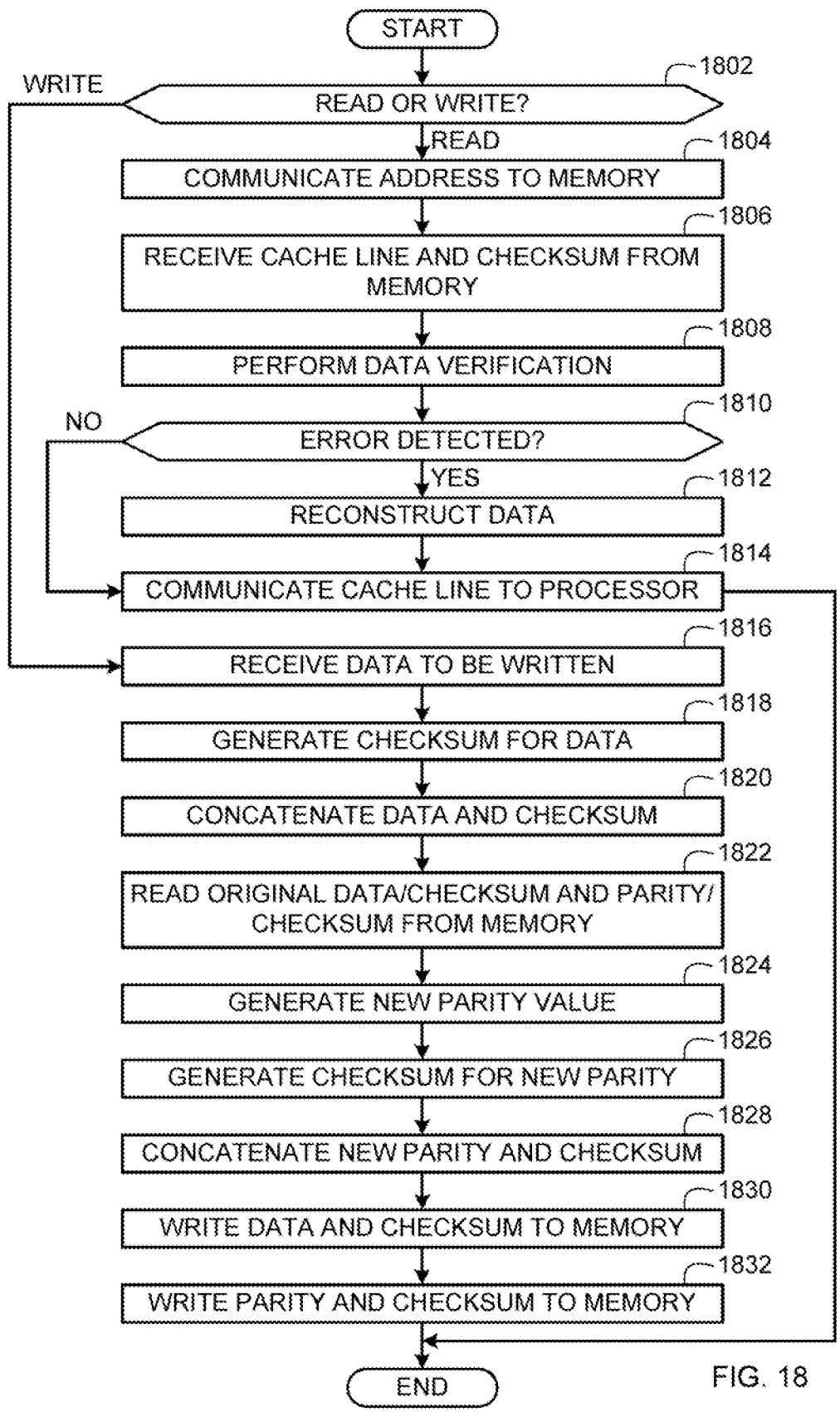
FIG. 18 depicts a flow diagram of an example process that can be used to perform error-checking and data correction operations when accessing data in a memory.

FIG. 18 is a flow diagram illustrating an example process that can be used to perform error-checking and data correction operations when accessing data in a memory. The example process of FIG. 18 is described in connection with the example memory controller 802 of FIG. 13 and the memory module 1700 of FIG. 17, but other processing devices and/or memories may be used in addition to or instead of the memory controller 802. Memory accesses performed in connection with the example process of FIG. 18 can be performed using SSA memory accesses as described above in connection with FIGS. 8-12.

Initially, the memory controller 802 determines whether it is to perform a read or write operation (block 1802). If the memory controller 802 is to perform a read operation, the memory address interface 1308 communicates an address to the memory module 1700 (block 1804). The address can be communicated as two separate address portions in two transfer cycles. The memory controller 802 then receives a cache line (e.g., the cache line L0 1704 of FIG. 17) and corresponding checksum (e.g., the checksum (C) 1706 of FIG. 17) (block 1806) via one of the data bus interfaces 1312a-h (FIG. 13). For example, the cache line and checksum can be latched into a corresponding one of the data concatenators 1314a-h (FIG. 13).

The error detector 1316 performs a data verification operation on the received cache line based on the received checksum value (block 1808). If an error is detected (block 1810), the data reconstructor 1322 performs a data reconstruction operation (block 1812). For example, the data reconstructor 1322 can cause the memory controller 802 to retrieve a parity value (e.g., the parity value 1708 of FIG. 17) corresponding to the corrupted cache line detected at block 1808 and all of the other cache lines (e.g., the cache lines L1-L7 of FIG. 7) corresponding to the retrieved parity value. The data reconstructor 1322 can then reconstruct an uncorrupt version of the requested cache line based on the other cache lines and the retrieved parity values using, for example, known reconstruction techniques associated with RAID-4 and/or RAID-5 data reconstruction processes.

If an error is not detected (block 1810) or after the data reconstructor 1322 reconstructs an uncorrupted cache line, the processor data interface 1304 (FIG. 13) communicates the requested cache line to a requesting processor (block 1814) and the process of FIG. 18 is ended.

If at block 1802 the memory controller 802 determines that it needs to perform a write operation, the processor data interface 1304 receives the data to be written from a processor (block 1816). The checksum generator 1318 generates a checksum value for the data to be written based on the data (block 1818), and one of the data concatenators 1314a-h concatenates the data to be written with the corresponding checksum value (block 1820). The parity generator 1320 (FIG. 13) causes the memory controller 802 to read the original data and checksum stored at the data location to be written and to read the parity value from the memory module 1700 (block 1822). For example, if the write operation is to write a value to the cache line L0 1704 (FIG. 17), the memory controller 802 reads the original value of the cache line L0 1704, the checksum value 1706, and the parity value 1708 and its checksum 1710.

The parity generator 1320 generates a new parity value based on the data to be written and its checksum value generated at block 1818 (block 1824). The checksum generator 1318 generates a new checksum value for the new parity value based on the parity value (block 1826). A corresponding one of the data concatenators 1314*a-h* concatenates the updated parity value with its new checksum value (block 1828). The memory controller 802 then writes the new cache line value and its checksum value to the memory module 1700 (block 1830) and writes the updated parity value and its checksum value to the memory module 1700 (block 1832). The example process of FIG. 18 is then ended.

In some example implementations, one or more of the example processes of FIGS. 14-16 and/or 18 may be implemented using machine readable instructions that, when executed, cause a device (e.g., a programmable controller or other programmable machine or integrated circuit) to perform the operations shown in FIGS. 14-16 and/or 18. For instance, the example processes of FIGS. 14-16 and/or 18 may be performed using a processor, a controller, and/or any other suitable processing device. For example, the example processes of FIGS. 14-16 and/or 18 may be implemented in coded instructions stored on a tangible machine readable medium such as a flash memory, a read-only memory (ROM), and/or a random-access memory (RAM) associated with a processor or controller. As used herein, the term tangible computer readable medium is expressly defined to include any type of computer readable storage and to exclude propagating signals. Additionally or alternatively, the example processes of FIGS. 14-16 and/or 18 may be implemented using coded instructions (e.g., computer readable instructions) stored on a non-transitory computer readable medium such as a flash memory, a read-only memory (ROM), a random-access memory (RAM), a cache, or any other storage media in which information is stored for any duration (e.g., for extended time periods, permanently, brief instances, for temporarily buffering, and/or for caching of the information). As used herein, the term non-transitory computer readable medium is expressly defined to include any type of computer readable medium and to exclude propagating signals.

Alternatively, the example processes of FIGS. 14-16 and/or 18 may be implemented using any combination(s) of application specific integrated circuit(s) (ASIC(s)), programmable logic device(s) (PLD(s)), field programmable logic device(s) (FPLD(s)), discrete logic, hardware, firmware, etc. Also, the example processes of FIGS. 14-16 and/or 18 may be implemented as any combination(s) of any of the foregoing techniques, for example, any combination of firmware, software, discrete logic, and/or hardware. Further, although the example processes of FIGS. 14-16 and/or 18 are described with reference to the flow diagrams of FIGS. 14-16 and/or 18, other methods of implementing the processes of FIGS. 14-16 and/or 18 may be employed. For example, the order of execution of the blocks may be changed, and/or some of the blocks described may be changed, eliminated, sub-divided, or combined. Additionally, any or all of the example processes of FIGS. 14-16 and/or 18 may be performed sequentially and/or in parallel by, for example, separate processing threads, processors, devices, discrete logic, circuits, etc.

FIGS. 19-20 depict example test settings and example memory energy parameters associated with analyzing the energy consumption and memory access performance of memory access techniques and structures disclosed herein relative to known memory access techniques and structures. As discussed below, the memory access techniques and structures disclosed herein advantageously impact the energy consumption and memory access performance of memory subsystems over known memory access techniques and structures.

FIG. 19 illustrated an example test bench parameters table 1900 showing example test bench parameters of an example processor system model used to analyze the performance of the methods, apparatus, and articles of manufacture disclosed herein. The example performance analyses discussed below were conducted by modeling a baseline 8-core out-of-order processor with private L1 caches and a shared L2 cache as indicated in the test bench parameters table 1900. For purposes of the performance analyses, baseline structures were implemented or modeled in accordance with a Micron SDRAM memory device (Micron part MT47H256M8).

For purposes of the performance analyses, the main memory capacity was set to 4 gigabytes and organized as shown in the test bench parameters table 1900. A VIRTUTECH® Simics full-system simulator was used to implement a simulation infrastructure with out-of-order timing supported by Simics' 'ooo-micro-arch' module. (Simics is a full-system simulator used to run production binaries of target hardware at high-performance speeds.) The 'trans-staller' module was heavily modified to accurately capture DRAM device timing information including multiple channels, ranks, banks and open rows in each bank. Both open-row and close-row page management policies with first-come-first-serve (FCFS) and first-ready-first come-first-serve (FR-FCFS) scheduling with appropriate queuing delays were modeled. In addition, overlapped processing of commands by the memory controller were modeled to hide pre-charge and activation delays. Also, bus models were used to model transfers of data between a memory controller and DIMMs. Address mapping policies were adopted from the DRAMSim framework (a memory system simulator). DRAM timing information was obtained from a Micron datasheet for part MT47H256M8.

Area, latency, and energy numbers of DRAM banks were obtained from CACTI 6.5 and were modified to include accurate models for commodity DRAM, both for the baseline memory design and with hierarchical wordlines. CACTI is a model that integrates models for cache and memory access time, cycle time, area, leakage, and dynamic power. By integrating all of these models together, tradeoffs between time, power, and area are all based on the same assumptions and, hence, are mutually consistent.

By default CACTI divides a large DRAM array into a number of mats and employs an H-tree to connect various mats. Such an organization incurs low latency but requires large area. However, traditional DRAM banks are heavily optimized for area to reduce cost and employ very large arrays with minimal peripheral circuitry overhead. In addition, a read or write operation is done using long bitlines spanning the array instead of using an H-tree interconnect. For the performance analyses, CACTI was modified to reflect a typical commodity DRAM implementation. While modeling hierarchical wordlines along with hierarchical bitlines, the number of MWL to SWL connectors can be reduced and, thus, the array area can also be reduced by trading off for increased bitline energy. For example, performing selective bitline activation in a second level bitline and reading all bitlines in a first level will increase energy but can significantly reduce the array area.

For purposes of the SBA performance analyses, a particular analytical model for hierarchical wordlines was incorporated into CACTI 6.5 to quantify the overhead of required die array area. A high area overhead was incurred when enough SWLs were introduced to activate exactly one cache line in a bank. This is because the area overhead introduced by the SWL 'AND' gate (e.g., the SWL 'AND' gate 712 of FIG. 7) and RX 'AND' gate (e.g., the RX 'AND' gate 710 of FIG. 7) signals was needed every few memory cells in the array. While this results in activating a minimum number of bitlines, the die-area cost may be prohibitive. However, energy can be traded off for lower cost by not being as selective. For example, 16 cache lines were read out instead of a single cache line per access, the SWLs become 16 times longer (e.g., 16 times less 'AND' gates). This still leads to relatively higher energy savings over the baseline, and an area overhead of only 12% over the baseline. The 16 cache line read outs are used in a close-page policy approach.

The example DRAM energy parameters used to conduct the performance analyses are shown in FIG. 20. In particular, FIG. 20 shows a table 2000 including example DRAM energy parameters of the memory access techniques and structures disclosed herein and known memory access techniques and structures. The baseline energy values shown in table 2000 are based on the Micron datasheet for part MT47H256M8 and Micron's System Power Calculator (http://www.micron.com/support/part info/powercalc). The SBA and SSA memory access techniques and structures disclosed herein were evaluated using subsets of the known multi-threaded PARSEC (Princeton Application Repository for Shared-Memory Computers), NAS (NASA Advanced Supercomputing), and STREAM (a simple synthetic benchmark program that measures sustainable memory bandwidth (in megabytes (MB)/s) and the corresponding computation rate for simple vector kernels) benchmark suites. During the analyses, applications were run for one million DRAM accesses and reported total energy consumption and instructions per cycle (IPC).

Figure 21:
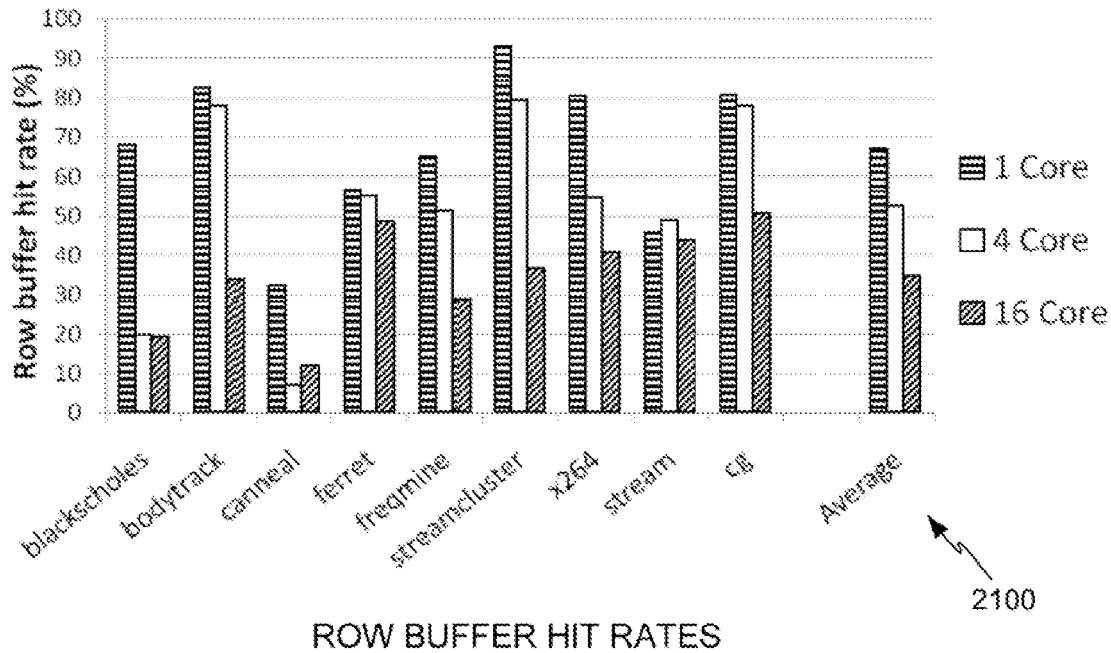
FIG. 21 is a graph showing example row buffer hit rates in an example code execution environment as a function of quantities of traditional memory arrays.
Figure 22:
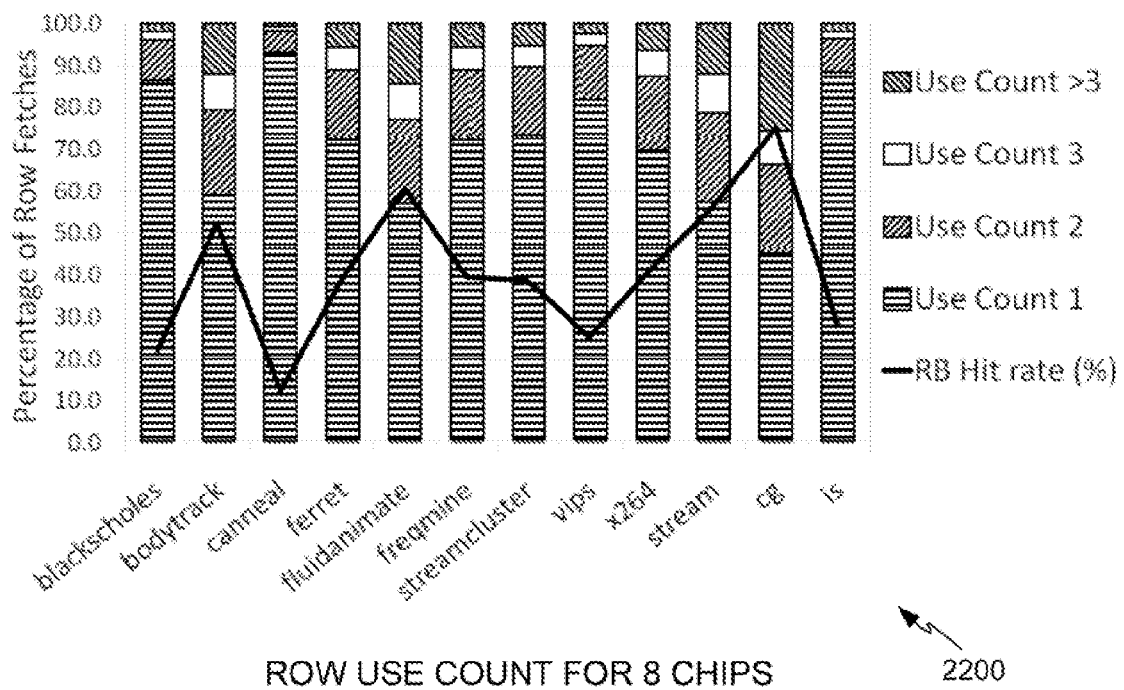
FIG. 22 is a graph showing example row re-use counts in an example code execution environment based on an 8-array traditional memory.

FIGS. 21 and 22 show performance graphs of row access operations for traditional memory devices in a code execution environment. In particular, graph 2100 of FIG. 21 shows row buffer hit rates in a code execution environment as a function of quantities of chips in traditional memories and graph 2200 of FIG. 22 shows row re-use counts in a code execution environment based on an 8-chip traditional memory. As shown in graph 2100, row-buffer hit rates steeply drop as the number of threads that simultaneously access memory increases. For instance, graph 2100 shows average rates drop from 67% for a 1 core system to 34% for a 16 core system. In addition, as shown in graph 2200 of FIG. 22, whenever a row is fetched into a row buffer (e.g., the row buffer 508 of FIG. 5), the number of times it is used before being closed due to a conflict is often just one or two times. This indicates that even on benchmarks with high locality and relatively good average row buffer hit rates (e.g., the NAS conjugate gradient (cg) benchmark), a large number of pages still exhibit relatively low reuse in the row-buffer. This means that the energy costs of activating an entire 8 kilobyte (KB) row (as in traditional memory access techniques) is amortized over only very few accesses, which wastes a significant amount of energy.

Figure 23:
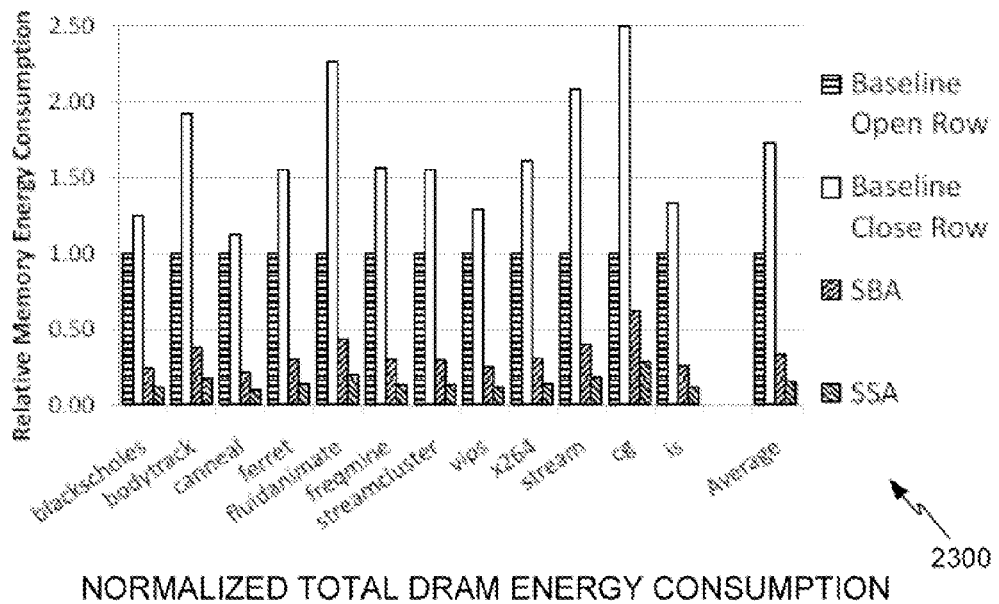
FIG. 23 is a graph comparing example normalized DRAM energy consumption for row/wordline accesses using known memory access techniques/structures and the example memory access techniques/structures disclosed herein.

Turning now to FIG. 23, a graph 2300 compares example normalized DRAM energy consumption for row/wordline accesses using known memory access techniques and structures and the memory access techniques and structures disclosed herein. In particular, graph 2300 shows the energy consumption using a close-row baseline, SBA memory accesses, and SSA memory accesses, normalized to the open-row baseline. As shown, the close-row baseline is relatively worse in terms of energy consumption than the open-row baseline. For instance, graph 2100 shows an average increase in energy consumption by 73%, with numbers for individual benchmarks varying based on their respective row-buffer hit rates. This is due to the fact that even accesses that were potentially row-buffer hits (thus not incurring the energy of activating the entire row again) need to perform an entire activate-read-precharge cycle.

Figure 24:
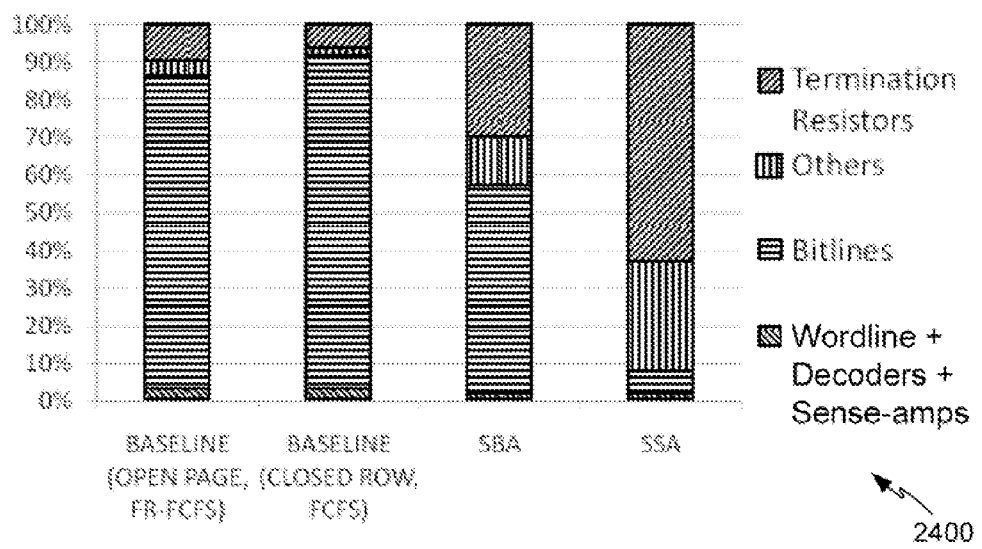
FIG. 24 is a graph comparing example DRAM energy consumed by different example memory subsystems when accessing rows/wordlines using known memory access techniques/structures and the memory access techniques/structures disclosed herein.

In FIG. 24, graph 2400 shows that in the baseline organizations (both open and close row), the total energy consumption in the baseline memory device is dominated by energy in the bitlines. This is because every access to a new row of the baseline memory device results in a large number of bitlines being activated twice (once to read data out of the cells into the row-buffer and once to pre-charge the array).

Using the SBA or SSA structures and memory access techniques disclosed herein eliminates a relatively large portion of the energy consumption components as shown in the graphs 2300 and 2400. By waiting for the CAS signal and only activating/pre-charging the exact cache line needed to serve a memory access request, bitline energy goes down by a factor of 128. This results in a dramatic energy reduction on every access. However, prohibitive area overheads (due to additional logic (e.g., the RX 'AND' gates 710 and corresponding lines and the SWL 'AND' gates 712 and corresponding lines of FIG. 7)) may sometimes dictate using a coarser grained selection in SBA, which may in some cases lead to slightly larger energy consumption compared to SSA. Compared to a baseline open-page system, SBA exhibits an average dynamic memory energy savings of 3× and SSA exhibits an average dynamic memory energy savings of over 6.4×. The results of FIGS. 23 and 24 show that SBA and SSA provide the most energy reduction in the bitlines. The energy overhead due to other components such as decoder, pre-decoder, inter-bank bus, bus termination, etc. remains relatively the same. Thus, their contribution to the total energy increases as bitline energy decreases.

In an open page policy, open row hits can sometimes have a relatively high energy efficiency because they do not involve any additional activation for subsequent accesses to that row when it is open. An analytical model was constructed to estimate how many cache lines had to be read out of a row buffer for the open-page baseline to match the energy per access of the SBA/SSA structures and memory access techniques. The results showed that the average level of row reuse needs to be 23. However, because the typical row reuse levels of known applications is relatively lower (as shown in graph 2200), energy performance of SBA/SSA is better than the baseline memory using an open-page policy.

Figure 25:
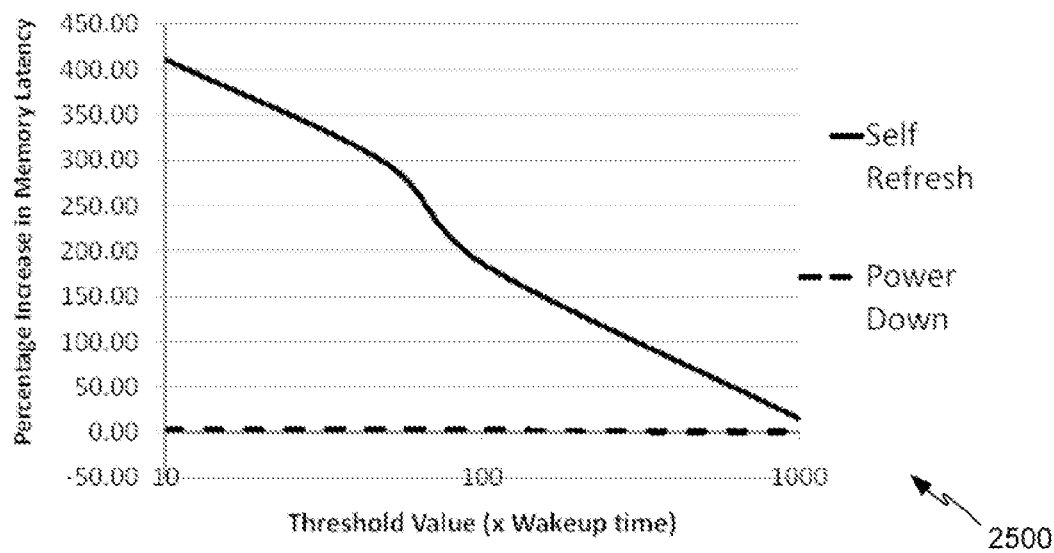
FIG. 25 is a graph showing example memory latency impact of using low-power states in connection with known memory access techniques/structures.
Figure 26:
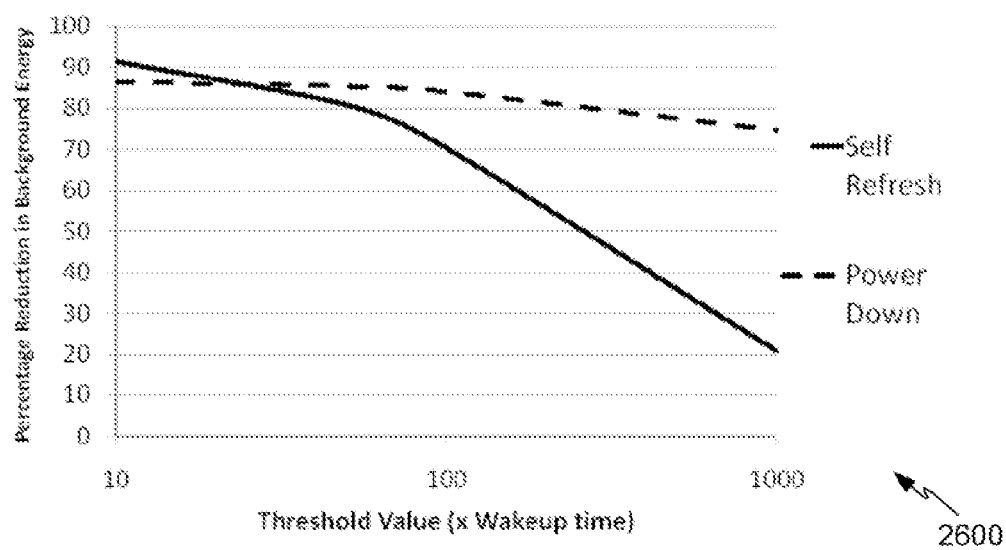
FIG. 26 is a graph showing example energy reduction impact of using low-power states in connection with known memory access techniques/structures.

Turning to FIGS. 25 and 26, graphs 2500 and 2600 show example impacts on memory latency and energy reduction, respectively, when using low-power states in connection with the known memory access techniques and structures. Localizing and managing DRAM accesses at a granularity as fine as a subarray (e.g., using SSA) allows more opportunity to place relatively larger portions of a DRAM into low-power states. Known DRAM devices support multiple levels of power-down (e.g., by turning off different levels of circuitry), each power-down level having a different wake-up latency penalty. For purposes of performance analyses, two simple low-power modes were evaluated with P (Power savings factor) and W (Wakeup) values calculated based on the energy numbers shown in table 2000 of FIG. 20 (obtained from the Micron datasheet and Micron's System Power Calculator). For the deepest sleep mode (i.e., self refresh mode) of a baseline memory device, P is 23 and W is 200 memory cycles. In a less deep sleep mode (i.e., power down mode) of the baseline memory device, P is lower at 7.5, and W is also lower at just 3 memory cycles. These measurements were conducted while varying the idle cycle threshold (I) as multiples of the wake-up time W.

The graphs 2500 and 2600 show an example impact of these low-power states on performance and energy consumption. As shown in graph 2600, the more latency-expensive low-power mode (self refresh mode) achieves relatively less energy savings compared to the more latency-efficient mode (power down mode). As shown in graph 2500, decreasing the frequency of transitions to low-power states (i.e., increase in idle cycle threshold (I)) causes a decrease in the average memory latency penalty from just under 4% to just over 0.5% for the power down mode. Energy savings correspondingly drop from 86% to 74% as shown in graph 2600. As shown in graph 2500, performance impacts are relatively larger for the latency-expensive self refresh mode, changing from over 400% at a very aggressive idle cycle threshold (I) to under 20% in the least aggressive idle cycle threshold (I) case. Corresponding energy savings range from 90% to 20% as shown in graph 2600. These power down modes can be applied to the baseline memory architecture as well. However, the granularity at which this can be done is much coarser due to the baseline memory being a DIMM bank at best. This means that there are fewer opportunities for the baseline memory to move into low-power states.

As a comparison, the application of the low-overhead power down state is analyzed relative to the baseline memory. On average, even with an aggressive sleep threshold, baseline memory banks can only be put in this low-overhead power down mode about 80% of the time, while incurring a penalty of 16% in terms of added memory latency. Unlike the SBA and SSA techniques disclosed herein, being less aggressive significantly impacts the ability to power down a baseline memory, with banks going into sleep mode only 17% of the time with a minimal 3% latency penalty. As another comparison point, comparisons are made for the percentage of time that subarrays or banks can be put in the deepest sleep mode (self refresh mode) in SSA vs. the baseline, for a constant 10% latency overhead. The results show that subarrays in SSA can go into deep sleep nearly 18% of the time whereas banks in a baseline memory can only go into deep sleep about 5% of the time.

Figure 27:
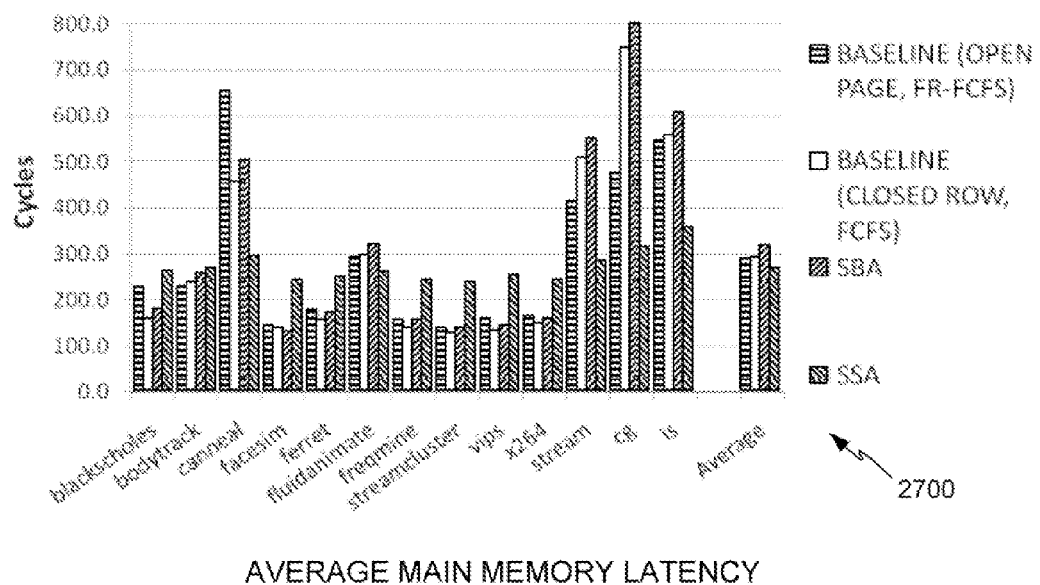
FIG. 27 is a graph comparing example average main memory latency when accessing memory using known memory access techniques/structures and the memory access techniques/structures disclosed herein.
Figure 28:
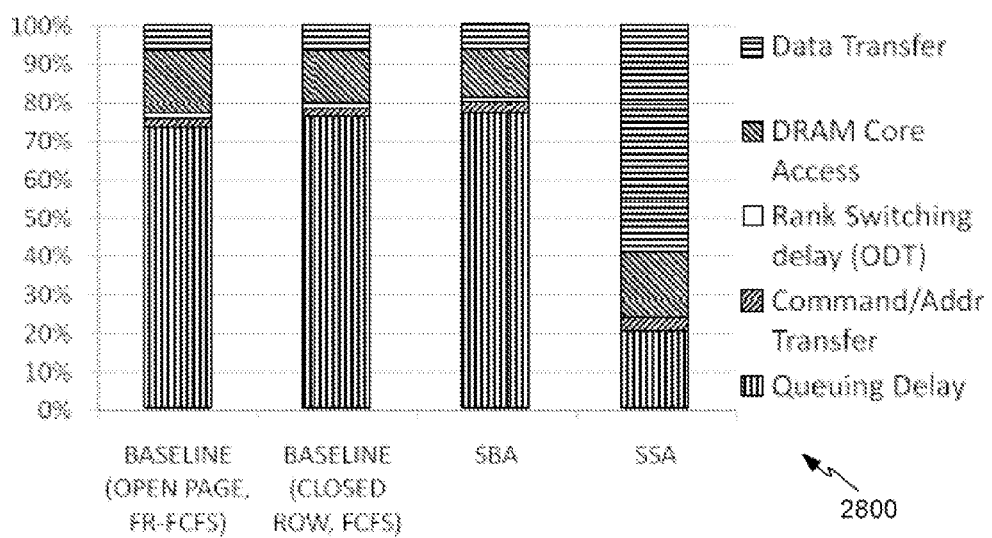
FIG. 28 is a graph comparing example memory latencies contributed by different memory subsystems when accessing memory using known memory access techniques/structures and the memory access techniques/structures disclosed herein.

FIG. 27 is a graph 2700 comparing example average main memory latency when accessing memory using known memory access techniques and structures and the memory access techniques and structures disclosed herein. FIG. 28 is a graph 2800 comparing example memory latencies contributed by different memory subsystems when accessing memory using known memory access techniques and structures and the memory access techniques and structures disclosed herein. Graph 2700 shows that employing either the SBA or SSA structures and memory access techniques has positive impacts on memory access latency. Graph 2800 breaks down the example latencies of graph 2700 down into the average contributions of the various memory components. One of the primary factors affecting latency is the page management policy. Moving to a close-page policy from an open-page baseline results in a drop in average memory latency by about 16% for a majority (8 of 13) of the benchmarks. This exhibits beneficial advantages of using a close-page policy in connection with the SBA and SSA structures and memory access techniques. The remaining benchmarks show an increase in memory latency by about 17% on average when moving to close-page. Employing the posted RAS technique described above in connection with the SBA structures and memory access techniques results in an additional small latency of just under 8% on average.

In the example graph 2800 the queuing delay is the dominant contributor to total memory access latency. However, this is also true in known DRAM systems. Thus, the additional latency introduced by the posted RAS of SBA does not significantly change average memory access latency.

For the example SSA structure and memory access techniques illustrated herein, each cache line return is serialized over, for example, eight lines to a memory controller. The delay introduced by such serialization becomes a dominant factor in the total access time. However, this is compensated for by a large increase in parallelism in the system. That is, each memory chip in a memory module can service independent sets of requests, significantly reducing the queuing delay. As a result, memory latency is not significantly increased, even though the data transfers are serialized. In 8 of the 12 benchmarks depicted in graph 2700, latency increases just over 40%. The other four benchmarks can exploit the parallelism much better, which compensates for the serialization latency with average access time decreasing by about 30%. These are also the applications with the highest memory latencies, and as a result SSA outperforms the baseline model.

Figure 29:
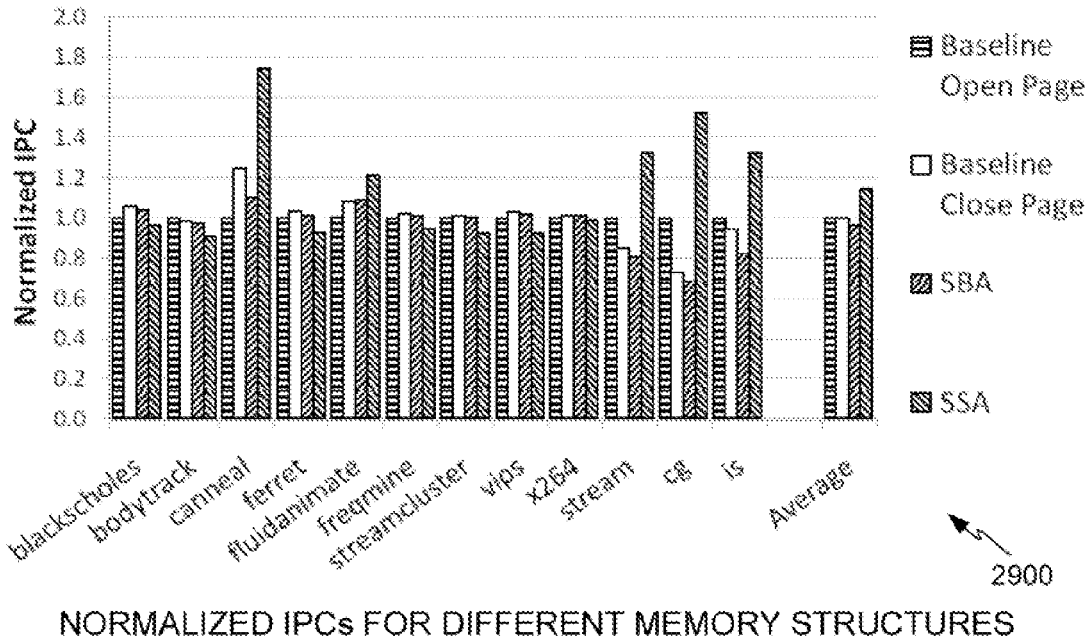
FIG. 29 is a graph comparing example normalized instructions per cycle for known memory access techniques/structures and the memory access techniques/structures disclosed herein.

FIG. 29 is a graph 2900 comparing example normalized IPCs for known memory access techniques and structures and the memory access techniques and structures disclosed herein. A majority of the example benchmarks show better performance with a close-row policy than with an open-row policy. In particular, there are performance improvements of just over 5% for 9 of the 12 benchmarks. The other three example benchmarks show performance decreases of about 20% on average. These were the benchmarks with relatively higher miss rates (on the order of 10 for every 1000 instructions). Employing the posted RAS of SBA results in a marginal decrease in IPC over close-row baseline (about 3% on average), which is largely influenced by the three highly sensitive benchmark applications (stream, cg, is).

The example SSA techniques illustrated herein exhibit a performance decrease of 5.5% on average compared to the open-page baseline on the five benchmarks that exhibited a memory latency increase in graph 2700 of FIG. 27. The other seven benchmarks with decreased memory access latency exhibit performance gains of 42% on average for SSA. These high numbers are observed because these applications are limited by bank contention and SSA addresses that bottleneck. In sum, in addition to significantly lowered DRAM access energies, SSA can boost performance, while yielding only minor decreases in performance. As the quantity of memory chips increases per memory subsystem and higher queuing pressures are exerted on memory controllers, SSA can be used to achieve even higher energy and performance improvements.

Figure 30:
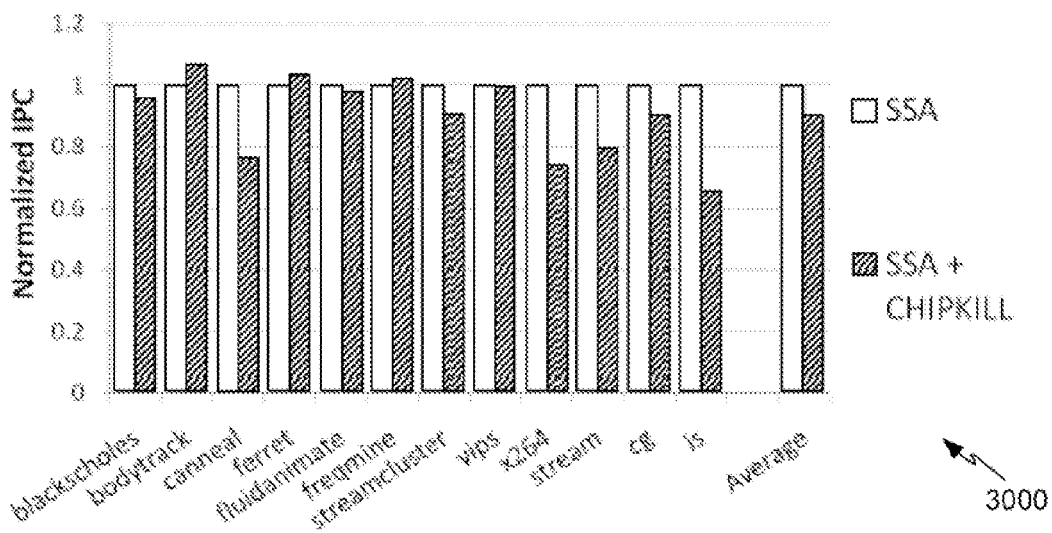
FIG. 30 is a graph comparing example differences in memory access performance for use and non-use of chipkill error detection and correction techniques.

FIG. 30 is a graph 3000 comparing example differences in memory access performance for use and non-use of chipkill error detection and correction techniques described above in connection with FIGS. 13, 17, and 18. In particular, graph 3000 shows the decrease in IPC performance resulting from using SSA with the chipkill approach disclosed herein. This is caused by the increased bank contention during writes. On average, the decrease in memory latency performance is 40%, resulting in an 11% decrease in IPC performance. Compared to the non-chipkill SSA implementation, there is also additional energy consumption on every write for the chipkill SSA implementation. This results in a 2.2× increase in dynamic energy to retain chipkill-level reliability, which is still significantly lower than the dynamic energy used by a baseline memory structure.

Although certain methods, apparatus, and articles of manufacture have been described herein, the scope of coverage of this patent is not limited thereto. To the contrary, this patent covers all methods, apparatus, and articles of manufacture fairly falling within the scope of the appended claims either literally or under the doctrine of equivalents.

What is claimed is:

1. A memory, comprising:
a row address register to store a row address corresponding to a row in a memory array;
a row decoder in circuit with the row address register to assert a signal on a wordline of the row after the memory receives a column address; and
a column decoder to selectively activate a portion of the row based on the column address and the signal asserted on the wordline.

2. A memory as defined in claim 1, further including an address buffer to latch the row address received from a memory controller and send the row address to the row address register and to latch the column address and send the column address to a column address register of the memory to facilitate concurrently decoding the row address and the column address at the memory.

3. A memory as defined in claim 2, wherein the memory is a first memory, the address buffer is located external to the first memory on a memory module containing the first memory and a second memory, the address buffer to send the row and column addresses to the first memory and the second memory.

4. A memory as defined in claim 1, wherein the portion of the row includes a cache line segment that forms a cache line addressed by the row and column addresses.

5. A memory as defined in claim 4, wherein the row and column decoders are to selectively activate a second portion of the memory array based on the same row and column addresses, the second portion containing a second cache line segment to form the cache line, and the row and column decoders to selectively activate additional portions until the entire cache line is output from a memory module containing the memory.

6. A memory as defined in claim 5, wherein the portion and the second portion are located in a corresponding row across the memory and a second memory of the memory module.

7. A memory as defined in claim 4, wherein the memory is a first memory, the first memory is located on a memory module containing a second memory, and a second cache line segment includes part of the cache line is to be activated in the second memory and output by the memory module in response to the row and column addresses.

8. A memory as defined in claim 1, wherein the row decoder is to assert a first signal on the wordline connected to a first input of a logic gate, the column decoder is to assert a second signal at a second input of the logic gate, the first and second signals to cause the logic gate to activate the portion of the row without activating a second portion of the row.

9. A memory as defined in claim 1, wherein the memory is a dynamic random access memory chip.

10. A memory as defined in claim 1, wherein the memory is located on one of a dual inline memory module (DIMM) containing a second memory or a 3D stack memory module containing the second memory.

11. A memory module, comprising:
a first memory having a first row;
a second memory having a second row; and
an address buffer to latch a row address and a column address and to forward the row and column addresses to the first and second memories, a row decoder of the first memory to selectively activate a first portion of the first row and a row decoder of the second memory to selectively activate a second portion of the second row in response to the row and column addresses, the first portion and the second portion activated without activating other portions of the first and second rows.

12. A memory module as defined in claim 11, wherein the first portion of the first row is a first cache line segment and the second portion of the second row is a second cache line segment, the first and second memories to output the first and second portions to form a cache line.

13. A memory module as defined in claim 11, wherein the row decoder of the first memory and the row decoder of the second memory are used to selectively activate portions of third and fourth rows respectively located in the first and second memories based on the same row address and the same column address, the portions respectively containing third and fourth cache line segments to form the cache line, and the row decoder of the first memory and the row decoder of the second memory selectively activating the portions of the third and fourth rows, respectively, until an entirety of the cache line is output from the memory module.

14. A memory module as defined in claim 11 structured as one of a dual inline memory module (DIMM) or a 3D stack memory module including the first and second memories.

15. A memory module as defined in claim 11, wherein the row decoder of the first memory asserts a first signal on a main wordline connected to a first input of a logic gate,
a column decoder of the first memory asserts a second signal at a second input of the logic gate, and
the first and second signals cause the logic gate to activate the first portion of the first row exclusive of other portions of the first row.

16. A method comprising:
storing a row address in a row address register;
storing a column address in a column address register;
concurrently decoding the row address and the column address by a row decoder and a column decoder, respectively;
activating, by the row decoder, a main wordline of a row corresponding to the row address;
activating, by the column decoder, a register select line corresponding to the column address, wherein activating the main wordline and the register select line together activate a wordline segment of the row; and
loading data from the wordline segment into a row buffer.

17. The method of claim 16, further comprising selecting the row address register for storing the row address based on assertion of a row address strobe signal.

18. The method of claim 16, wherein the main wordline and the register select line are connected to respective inputs of a logic gate, and the activating the main wordline and the register select line together causes the logic gate to activate the wordline segment without activating other portions of the row.

* * * * *